(12) United States Patent
Ookawa et al.

(10) Patent No.: US 9,652,100 B2
(45) Date of Patent: May 16, 2017

(54) ELECTROCONDUCTIVE FILM COMPRISING BASE MATERIAL FILM AND ONE OR MORE FUNCTIONAL LAYERS CONFIGURED TO SUPPRESS VARIATIONS OF HUE BETWEEN DIFFERENT VIEWING ANGLES

(71) Applicant: DAI NIPPON PRINTING CO., LTD., Tokyo (JP)

(72) Inventors: Koujirou Ookawa, Tokyo (JP); Takashi Kuroda, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 50 days.

(21) Appl. No.: 14/660,111

(22) Filed: Mar. 17, 2015

(65) Prior Publication Data
US 2015/0268771 A1    Sep. 24, 2015

(30) Foreign Application Priority Data
Mar. 18, 2014    (JP) .................................. 2014-055401

(51) Int. Cl.
*G06F 3/044*    (2006.01)
*G09G 5/00*    (2006.01)
(Continued)

(52) U.S. Cl.
CPC .............. *G06F 3/044* (2013.01); *G09G 5/003* (2013.01); *H05K 1/0274* (2013.01);
(Continued)

(58) Field of Classification Search
CPC .... G06F 3/044; G09G 5/003; G09G 2300/04; H05K 1/0274; H05K 1/0326; H05K 2201/0108; H05K 2201/0326
See application file for complete search history.

(56) References Cited

U.S. PATENT DOCUMENTS

| 2006/0269733 A1* | 11/2006 | Mizuno | C09D 4/00 428/304.4 |
| 2008/0138589 A1* | 6/2008 | Wakabayashi | G06F 3/044 428/195.1 |

(Continued)

FOREIGN PATENT DOCUMENTS

| JP | 2005-099778 A1 | 4/2005 |
| JP | 2011-098563 A1 | 5/2011 |

(Continued)

OTHER PUBLICATIONS

Korean Office Action (Application No. 10-2015-0032232) dated Nov. 4, 2015 (with English translation).

(Continued)

*Primary Examiner* — Ryan A Lubit
(74) *Attorney, Agent, or Firm* — Burr & Brown, PLLC

(57) ABSTRACT

Provided is an electroconductive film including a base material film provided with a light transmissive base material (20), and one or more functional layers laminated on a single or both sides of the light transmissive base material; a transparent electroconductive layer, which is provided on the functional layer, and patterned; and a lead-out electrode electrically connected with the transparent electroconductive layer; wherein when the base material film is irradiated with light from a surface side of the functional layer while an incidence angle is varied every five degrees in a range of 5° or more and 75° or less to determine a* and b* values of the base material film in a L*a*b* color system from reflected light toward each regular reflection direction, a variation of the a* values is 1.0 or less, and a variation of the b* values is 3.0 or less.

18 Claims, 20 Drawing Sheets

(51) Int. Cl.
*H05K 1/02* (2006.01)
*H05K 1/03* (2006.01)

(52) U.S. Cl.
CPC ....... *H05K 1/0326* (2013.01); *G09G 2300/04* (2013.01); *H05K 2201/0108* (2013.01); *H05K 2201/0326* (2013.01)

(56) References Cited

U.S. PATENT DOCUMENTS

| | | | | |
|---|---|---|---|---|
| 2010/0194717 | A1* | 8/2010 | Mori | H01L 51/5268 345/204 |
| 2012/0114919 | A1* | 5/2012 | Nakajima | G06F 3/044 428/203 |
| 2012/0312677 | A1* | 12/2012 | Kuriki | G06F 3/044 200/600 |
| 2013/0175154 | A1* | 7/2013 | Takahashi | G06F 3/044 200/600 |
| 2015/0116264 | A1* | 4/2015 | Ookawa | G06F 3/0412 345/174 |
| 2015/0118455 | A1* | 4/2015 | Ookawa | G06F 3/0412 428/201 |
| 2015/0152279 | A1* | 6/2015 | Kai | C09D 7/12 428/216 |
| 2015/0301667 | A1* | 10/2015 | Yano | G06F 3/044 345/173 |
| 2016/0092005 | A1* | 3/2016 | Toyoshima | H01L 27/323 345/174 |

FOREIGN PATENT DOCUMENTS

| | | |
|---|---|---|
| JP | 10-2014-0030339 A1 | 3/2014 |
| JP | 5447728 B1 | 3/2014 |
| KR | 10-2014-0030339 A1 | 3/2014 |
| WO | WO/2012/043189  *  5/2012 | ............. G06F 3/041 |

OTHER PUBLICATIONS

Korean Office Action (Application No. 10-2015-0032232) dated Mar. 2, 2016 (with English translation).
Korean Office Action (Application No. 10-2015-0032232) dated Mar. 2, 2015 (with English translation).

* cited by examiner

ELECTROCONDUCTIVE FILM COMPRISING BASE MATERIAL FILM AND ONE OR MORE FUNCTIONAL LAYERS CONFIGURED TO SUPPRESS VARIATIONS OF HUE BETWEEN DIFFERENT VIEWING ANGLES

CROSS-REFERENCE TO RELATED APPLICATIONS

This application is based upon and claims the benefit of priority from Japanese Patent Application No. 2014-055401, filed Mar. 18, 2014; the entire contents of which are incorporated herein by reference.

BACKGROUND OF THE INVENTION

Field of the Invention

The present invention relates to an electroconductive film, and a touch panel sensor.

Background Art

Nowadays, as an input means a touch panel device has been widely used. A touch panel device includes a touch panel sensor, a control circuit for detecting a contact position on the touch panel sensor, a wiring, and a FPC (flexible printed circuit). A touch panel device is often used as an input means together with a display device in various apparatus (e.g. a ticket-vending machine, an automated teller machine, a cell phone, and a video game console) incorporated with a display device, such as a liquid crystal display and a plasma display. In such a device, a touch panel sensor is placed on a display screen of a display device, to thereby enable extremely direct input into the display device.

Touch panel devices are classified into various types based on the principle for detecting a contact position (approach position) on a touch panel sensor. A capacitance type touch panel device has drawn attention recently for reasons that it is optically bright, favorable in design, simply structured, superior in functions, etc. Although there are a surface type and a projection type in the capacitance type, a projection type is spotlighted, because it is suitable for addressing multi-touch recognition (multipoint recognition).

An example of an electroconductive film to be used in a touch panel of the projection-type capacitance-type includes a base material film and a transparent electroconductive layer formed on the base material film (e.g. refer to Japanese Unexamined Patent Application Publication No. 2011-98563). A transparent electroconductive layer is patterned, and functions as a sensor electrode of a touch panel.

SUMMARY OF THE INVENTION

Currently, there is a tendency for a touch panel device to have a larger area, and a screen size increases in step with the increase in the area of a touch panel device, and therefore the viewing angle tends to vary widely depending on a viewing position over the touch panel device. A base material film for a touch panel sensor used in a touch panel device is designed on the premise that it is viewed from the front, however based on such a design philosophy on the premise of viewing from the front, the hue will vary depending on a viewing angle, and therefore may not be able to cope with the increase in the area of a touch panel device.

The present invention was made to solve the aforedescribed problem. In other words, an object thereof is to provide an electroconductive film, and a touch panel sensor that can suppress variation range of the hue, when viewed at various angles.

In an aspect of the present invention, is provided an electroconductive film comprising a base material film provided with a light transmissive base material, and one or more functional layers laminated on a single or both sides of the light transmissive base material, a transparent electroconductive layer, which is provided on the functional layer, and patterned, and a lead-out electrode electrically connected with the transparent electroconductive layer; wherein when the base material film is irradiated with light from a surface side of the functional layer while an incidence angle is varied every five degrees in a range of 5° or more and 75° or less, assuming that a normal direction of a surface of the base material film is 0°, to determine a* and b* values of the base material film in a L*a*b* color system from reflected light toward each regular reflection direction, a variation of the a* values is 1.0 or less, and a variation of the b* values is 3.0 or less with respect to the base material film.

By an electroconductive film according to an aspect of the present invention and a touch panel sensor according to another aspect, the variation of hue, when viewed from various angles, can be suppressed.

DETAILED DESCRIPTION OF THE INVENTION

[First Embodiment]

Figure 1:
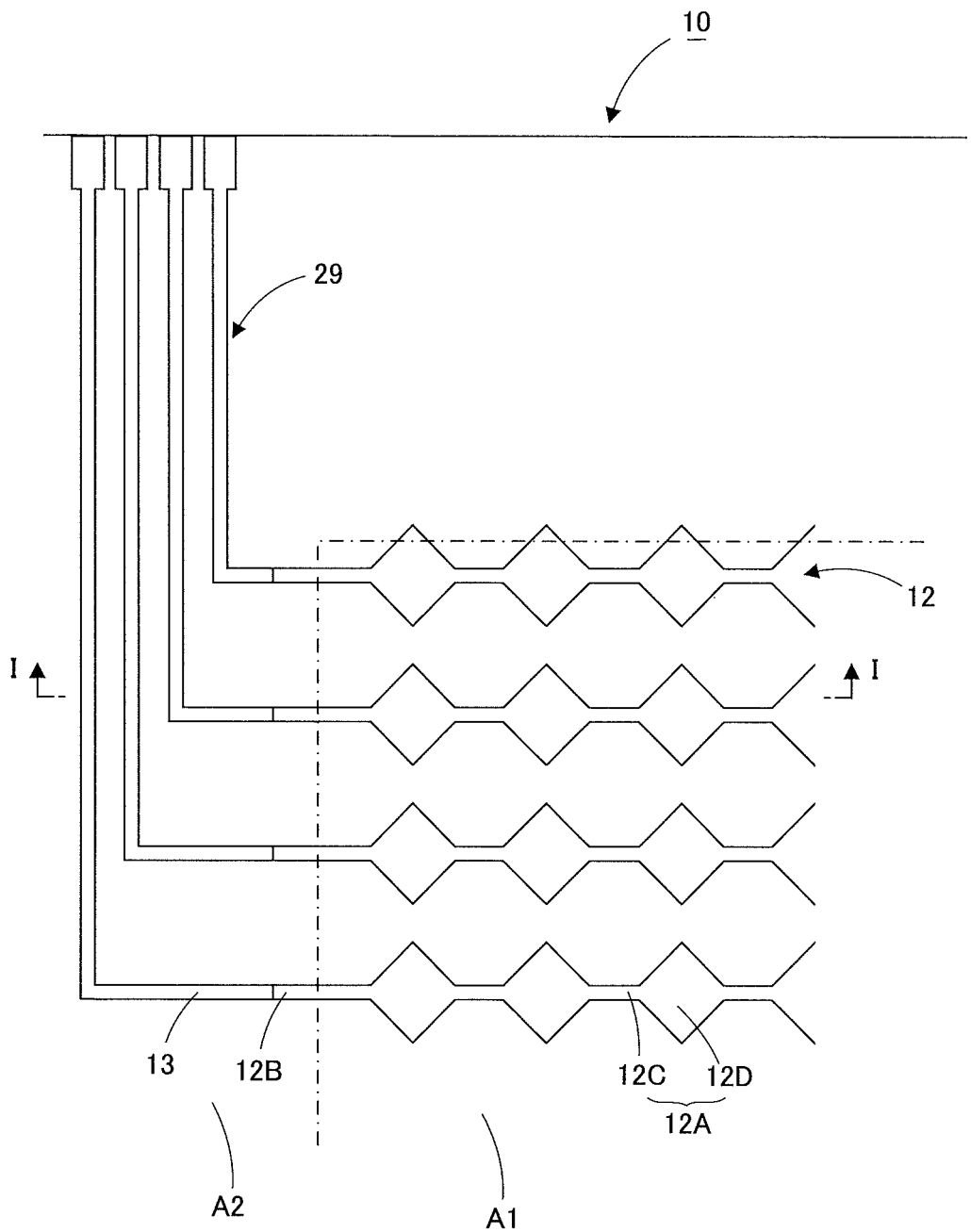
FIG. 1 is a plan view of an electroconductive film according to the first Embodiment.
Figure 2:
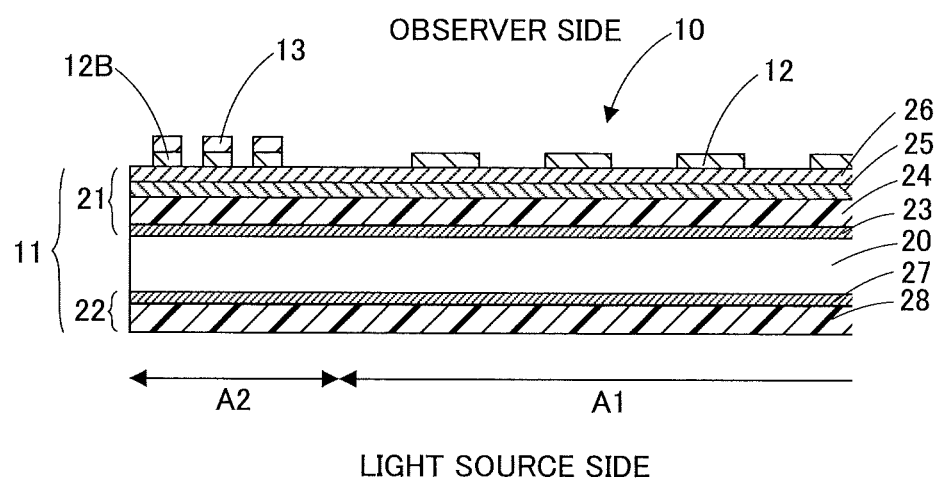
FIG. 2 is a cross-sectional view along the line I-I in FIG. 1.
Figure 3:
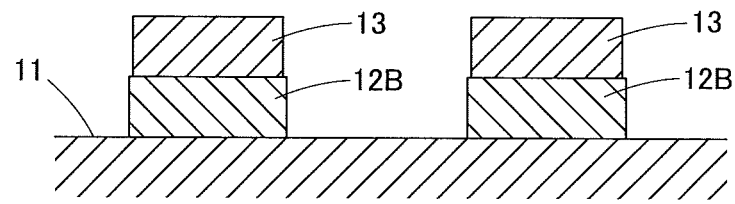
FIG. 3 is an enlarged view of a part of FIG. 2.
Figure 4:
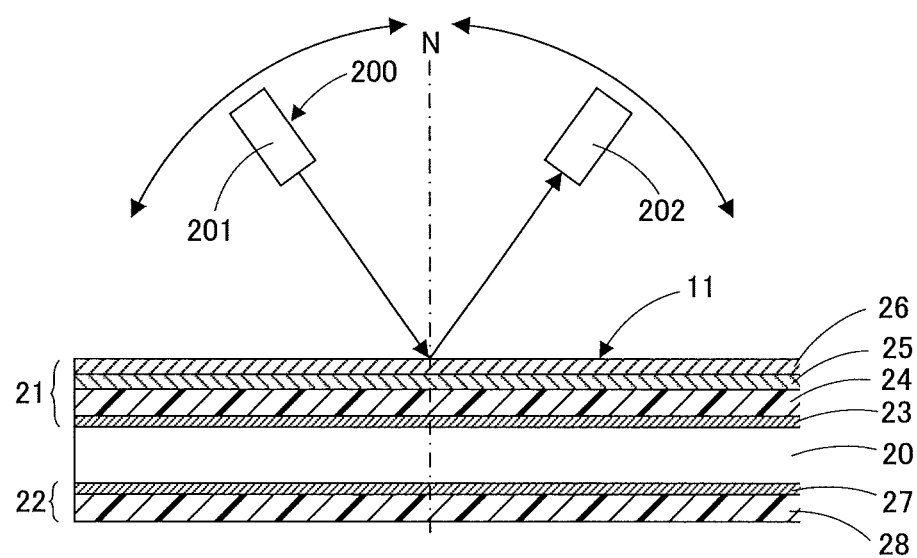
FIG. 4 is a schematic diagram of a situation where the a* and b* of a base material film are measured with a spectrophotometer.
Figure 11:
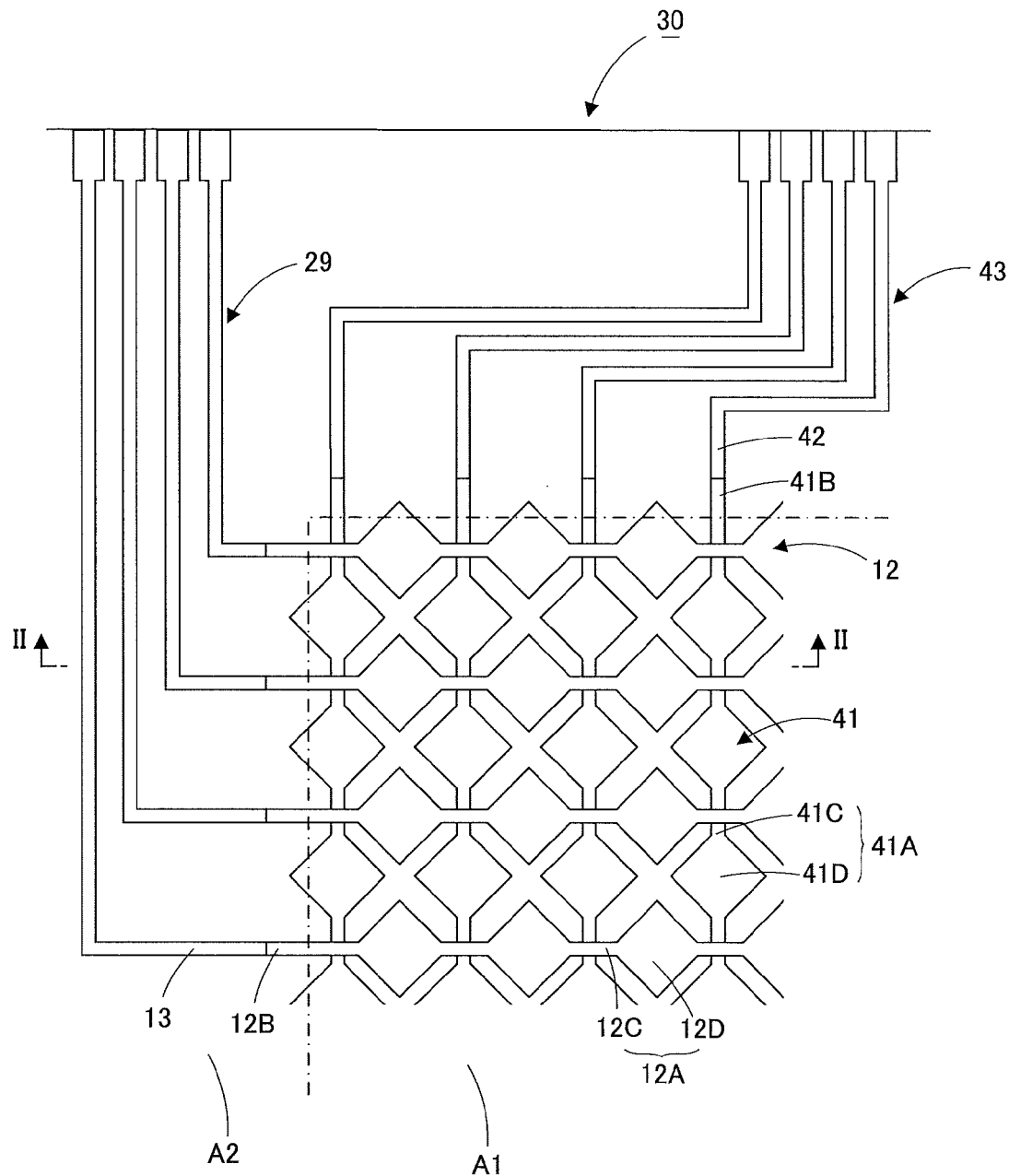
FIG. 11 is a plan view of a touch panel sensor according to the first Embodiment.
Figure 12:
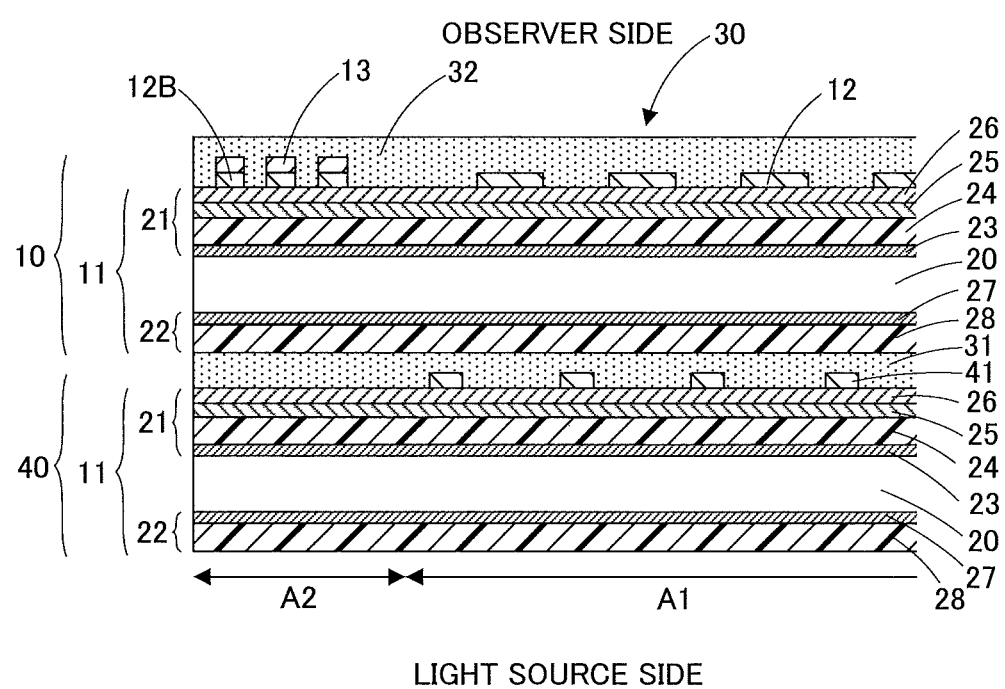
FIG. 12 is a cross-sectional view along the line II-II in FIG. 11.

An electroconductive film and a touch panel sensor of an Embodiment according to the present invention will be described below referring to the drawings. FIG. 1 is a plan view of an electroconductive film according to the present Embodiment, FIG. 2 is a cross-sectional view along the line I-I in FIG. 1, and FIG. 3 is an enlarged view of a part of FIG. 2. FIG. 4 is a schematic diagram of a situation where the spectral reflectance of a base material film is measured with a spectral reflectance analyzer, and FIG. 5A to FIG. 10 are schematic diagrams showing a process step for producing an electroconductive film according to the present Embodiment. FIG. 11 is a plan view of a touch panel sensor according to the present Embodiment, and FIG. 12 is a cross-sectional view along the line II-II in FIG. 11. Terms, such as "film", "sheet", "plate", etc. herein are not discriminated from each other merely by difference in name. Consequently, for example, a "film" is a concept including a material, which may be also called as a sheet, or a plate. As a specific example, an "electroconductive film" includes also a material called as an "electroconductive sheet" or the like, and a "base material film" includes also a material called as a "substrate sheet" or the like.

<Electroconductive Film>

An electroconductive film 10 shown in FIG. 1 and FIG. 2 includes a base material film 11, a patterned transparent electroconductive layer 12 provided on one side of the base material film 11, and a lead-out electrode 13 electrically connected with the transparent electroconductive layer 12.

<Base Material Film>

The base material film 11 shown in FIG. 2 includes a light transmissive base material 20 and one or more functional layers 21, 22 laminated on both sides of the light transmissive base material 20. Each of the functional layers 21, 22 may be constituted with a single layer, but preferably respectively with 2 or more laminated layers. Although in the present Embodiment the functional layers 21, 22 are laminated on both sides of the light transmissive base material 20, one or more functional layers are required to be laminated on a single side of a light transmissive base material, and not required to be laminated on both sides of a light transmissive base material.

When the base material film 11 is irradiated with visible light from the side of the functional layer 21 (from the side of the low refractive index layer 26) while an incidence angle is varied every five degrees in a range of 5° or more and 75° or less, assuming that a normal direction of a surface of the base material film 11 is 0°, to determine a* and b* values in a L*a*b* color system from reflected light toward each regular reflection direction, a variation of the a* values is 1.0 or less, and a variation of the b* values is 3.0 or less with respect to the base material film 11. "L*a*b* color system", "a", and "b*" are as defined according to JIS Z8729.

An a* value and a b* value are measured according to JIS Z8722, and specifically they can be determined, for example, with a publicly known spectrophotometer. A spectrophotometer 200 shown in FIG. 4 includes a light source 201, which can move in a range of 5° or more and 75° or less, and a detector 202, which moves synchronized with the movement of the light source so as to receive reflected light in a regular reflection direction. The movement angle of the light source 201 is based on the normal direction N to the base material film 11 as 0°. The light source 201 radiates light to the base material film 11, and the detector 202 receives reflected light in the regular reflection direction, then an a* value and a b* value can be determined for the reflected light received by the detector 202. Examples of a spectrophotometer include an absolute reflectance measurement instrument VAR-7010 and an ultraviolet-visible near-infrared spectrophotometer V-710 made by Jasco Corporation. Examples of a light source include a tungsten halogen (WI) lamp as a simple item, and a deuterium (D2) lamp and a tungsten halogen (WI) lamp in a combination.

When the incidence angle increases in the above measurement, the reflectance difference between S polarization and P polarization increases also, therefore it is preferable for an accurate measurement to use a polarizer, of which the transmission axis is tilted at 45°.

Although in FIG. 4 an a* value and a b* value of the base material film 11 are determined in a state, where the transparent electroconductive layer 12 has not been formed, in a case where the transparent electroconductive layer 12 has been formed in the base material film 11, an a* value and a b* value can be determined similarly as above by irradiating with light a region where the transparent electroconductive layer 12 is absent and the base material film 11 is exposed.

The variation range of a* values and b* values can be determined by measuring an a* value and a b* value at each incident angle with an aforedescribed spectrophotometer and calculating an absolute value of a difference between the maximum value and the minimum value among them. The variation range of a* values is preferably 0.4 or less, and the variation range of b* values is preferably 1.6 or less, and more preferably 1.55 or less.

The color difference ΔE*ab between the reflected light at an angle, at which the a* value and b* value have been measured and the reflected light at another angle, at which the a* value and b* value have been measured, is preferably 5 or less. "ΔE*ab" is in accordance with JIS Z8730.

<Light Transmissive Base Material>

Although there is no particular restriction on a light transmissive base material 20, insofar as the same has light transmissiveness, and examples thereof include a polyolefin base material, a polycarbonate base material, a polyacrylate base material a polyester base material, an aromatic poly (ether ketone) base material, a poly(ether sulfone) base material, and a polyamide base material.

Examples of a polyolefin base material include base materials containing as a component at least one kind of polyethylene, polypropylene, and a cyclic polyolefin. Examples of a cyclic polyolefin include those having a norbornene backbone.

Examples of a polycarbonate base material include an aromatic polycarbonate base material based on bis-phenols (bisphenol A, etc.) and a base material of an aliphatic polycarbonate, such as di(ethylene glycol) bis(allyl carbonate).

Examples of a polyacrylate base material include poly (methyl (meth)acrylate) base material, a poly(ethyl (meth) acrylate) base material, and a poly[(methyl (meth)acrylate)-co-(butyl (meth)acrylate)] base material.

Examples of a polyester base material include base materials containing as a component at least one kind of poly (ethylene terephthalate) (PET), polypropylene terephthalate), poly(butylene terephthalate), and poly(ethylene naphthalate) (PEN).

Examples of an aromatic poly(ether ketone) base material include a poly(ether ether ketone) (PEEK) base material.

There is no particular restriction on the thickness of the light transmissive base material 20, and it can be 5 μm or more and 300 μm or less. The lower limit of the thickness of a light transmissive base material 20 is preferably 25 μm or more from a viewpoint of a handling property, and more preferably 50 μm or more. The upper limit of the thickness of the light transmissive base material 20 is preferably 250 μm or less from a viewpoint of reduction of film thickness.

The surface of the light transmissive base material 20 may be subjected to a physical treatment for improving adhesiveness, such as a corona discharge treatment, and an oxidation treatment.

<Functional Layer>

The functional layers 21, 22 are layers, which are intended to exhibit some kind of a function in the base material film 11, and specific examples thereof include an easily adhesive layer, a hard coat layer, a high refractive index layer, and a low refractive index layer.

When a functional layer has 2 or more layers, for example, an easily adhesive layer, a hard coat layer, a high refractive index layer, and a low refractive index layer may be layered one on another from the side of a light transmissive base material in the order mentioned; a hard coat layer, a high refractive index layer, and a low refractive index layer may be layered one on another from the side of a light transmissive base material in the order mentioned; or a high refractive index layer, and a low refractive index layer may be layered one on the other from the side of a light transmissive base material in the order mentioned. When a functional layer has a single layer, the functional layer may be, for example, a high refractive index layer or a low refractive index layer.

When functional layers are formed on both the sides, the type or the layer number of a functional layer on a surface of a light transmissive base material, and the same of a functional layer on the other surface may be identical or different. For example, on a surface of a light transmissive base material an easily adhesive layer, a hard coat layer, a high refractive index layer, and a low refractive index layer may be provided in the order mentioned, and on the other surface of the light transmissive base material an easily adhesive layer, a hard coat layer and a high refractive index layer may be provided in the order mentioned, or alternatively on a surface of a light transmissive base material an easily adhesive layer, a hard coat layer, a high refractive index layer, and a low refractive index layer may be provided in the order mentioned, and on the other surface of the light transmissive base material a hard coat layer, a high refractive index layer, and a low refractive index layer may be provided in the order mentioned. In the present Embodiment, on a surface of the light transmissive base material 20, an easily adhesive layer 23, a hard coat layer 24, a high refractive index layer 25, and a low refractive index layer 26 are layered one on another in the order mentioned as the functional layer 21, and on the other surface of the light transmissive base material 20 an easily adhesive layer 27 and a hard coat layer 28 are layered in the order mentioned as the functional layer 22.

(Easily Adhesive Layer)

The easily adhesive layers 23, 27 are layers for improving adherence between the light transmissive base material 20 and another functional layer (a hard coat layer). The easily adhesive layers 23, 27 may be composed of a coating material called as an anchor agent or a primer. As the anchor agent or the primer, for example, at least any of a thermoplastic resin, such as a polyurethane resin, a polyester resin, a poly(vinyl chloride) resin, a poly(vinyl acetate) resin, a vinyl chloride-vinyl acetate copolymer, an acrylic resin, a poly(vinyl alcohol) resin, a poly(vinyl acetal) resin, a copolymer of ethylene with vinyl acetate or acrylic acid, a copolymer of ethylene with styrene and/or butadiene, and an olefinic resin, and/or modified resins thereof; a polymer of a photopolymerizing compound; and a thermosetting resin, such as an epoxy resin, may be used.

The refractive index of the easily adhesive layers 23, 27 is preferably 1.40 or more and 1.70 or less. The lower limit of the refractive index of the easily adhesive layers 23, 27 is preferably 1.50 or more, and the upper limit of the refractive index of the easily adhesive layers 23, 27 is preferably 1.60 or less. Although the refractive indices of the easily adhesive layer 23 and the easily adhesive layer 27 are preferably within the above range respectively, however are not necessarily required to be identical.

The refractive index of the easily adhesive layers 23, 27 can be measured on a prepared single layer thereof with an Abbe refractometer (NAR-4T, made by Atago Co., Ltd.) or an ellipsometer. As a measuring method of the refractive index after the base material film 11 is produced, the easily adhesive layers 23, 27 are shaved off separately with a cutter knife, etc. to prepare samples in a powder form, and then perform the Becke method on the sample in conformity with the B method in JIS K7142 (2008) (for a transparent material in a particulate or granular form). By the Becke method, a Cargill reagent with a known refractive index is dropped on the sample in a powder form placed on a slide glass, etc. to immerse the sample in the reagent, the sample in such a state is observed under a microscope to find visually whether a bright line (Becke line) appearing along a sample outline due to difference in refractive indices between the sample and a reagent vanishes, and the refractive index of a reagent, with which the bright line (Becke line) becomes visually not recognizable, is determined as the refractive index of the sample.

The film thickness of the easily adhesive layers 23, 27 is preferably 50 nm or more and 150 nm or less. When the thickness of the easily adhesive layers 23, 27 is 50 nm or more, good adherence between the light transmissive base material 20 and another functional layer can be achieved by the easily adhesive layers 23, 27. The film thickness of the easily adhesive layers 23, 27 can be measured by a cross-sectional microscopic observation. The lower limit of the thickness of an easily adhesive layer 23, 27 is more preferably 100 nm or more, and the upper limit is more preferably 130 nm or less. The film thicknesses of the easily adhesive layer 23 and the easily adhesive layer 27 are preferably within the above range, however are not necessarily required to be identical.

(Hard Coat Layer)

The hard coat layers 24, 28 are layers having hardness of "H" or higher in a pencil hardness test (4.9 N load) according to JIS K5600-5-4 (1999). With the pencil hardness "H" or higher, the hardness of the hard coat layer 24 can influence adequately the surface of the low refractive index layer 26, so as to improve the durability. In this connection, from viewpoints of adherence with the high refractive index layer 25 to be formed on the hard coat layer 24, toughness, and prevention of curling, the upper limit of pencil hardness of the surface of the hard coat layer 24 is preferably approx. 4H. Since a touch panel sensor is pushed repeatedly and a high degree of adherence and toughness is required, by setting the upper limit of pencil hardness of the hard coat layers 24, 28 at 4H, a remarkable effect can be exhibited, when the base material film 11 is used incorporated in the touch panel sensor 10. While, in order to crystallize a transparent electroconductive layer after the electroconductive layer is formed on a base material film, the base material film is heated in a state that the transparent electroconductive layer has been formed. By the heating, an oligomer may occasionally precipitate from a light transmissive base material to increase the haze of the base material film, however, since a hard coat layer can function as a layer suppressing precipitation of an oligomer, increase in the haze of the base material film can be suppressed by providing the hard coat layers 24, 28.

The refractive index of the hard coat layers 24, 28 is preferably 1.45 or more and 1.60 or less. The lower limit of the refractive index of the hard coat layers 24, 28 is preferably 1.48 or more, and the upper limit of the refractive index of the hard coat layers 24, 28 is preferably 1.57 or less. When the hard coat layers 24, 28 are formed on both sides of the light transmissive base material 20 as in the case of the present Embodiment, the respective refractive indices of the hard coat layers 24, 28 are preferably within the above range, however, are not necessarily required to be identical. The refractive index of the hard coat layers 24, 28 can be measured by a similar method as above for the refractive index of the easily adhesive layers 23, 27.

The film thickness of the hard coat layers 24, 28 is preferably 0.5 μm or more. When the thickness of the hard coat layers 24, 28 is 0.5 μm or more, desired hardness can be obtained. The film thickness of the hard coat layers 24, 28 can be measured by a cross-sectional microscopic observation. The lower limit of the thickness of the hard coat layers 24, 28 is more preferably 1.0 μm or more, the upper limit is more preferably 7.0 μm or less, and the thickness of the hard coat layers 24, 28 is further preferably 1.5 μm or more and 5.0 μm or less. When the hard coat layers 24, 28 are formed on both sides of a light transmissive base material 20 as in the case of the present Embodiment, the respective thicknesses of the hard coat layers 24, 28 are preferably within the above range, however, are not necessarily required to be identical.

The hard coat layers 24, 28 may be, for example, composed of a resin. The resin contains a polymer (crosslinked substance) of a photopolymerizing compound. The resin may contain in addition to a polymer (crosslinked substance) of a photopolymerizing compound a solvent drying type resin, or a thermosetting resin. The photopolymerizing compound contains at least one photopolymerizing functional group. The term a "photopolymerizing functional group" means herein a functional group, which is able to polymerize by irradiation with light. Examples of a photopolymerizing functional group include an ethylenic double bond, such as a (meth)acryloyl group, a vinyl group, and an allyl group. The expression of "(meth)acryloyl group" is a concept including both an "acryloyl group" and a "methacryloyl group". Examples of light with which a photopolymerizing compound is irradiated for polymerization include visible light, and ionizing radiation, such as ultraviolet light, X-ray, electron beam, α-ray, β-ray, and γ-ray.

Examples of a photopolymerizing compound include a photopolymerizing monomer, a photopolymerizing oligomer, and a photopolymerizing prepolymer, and they may be used after appropriate conditioning. As a photopolymerizing compound, a combination of a photopolymerizing monomer with a photopolymerizing oligomer or a photopolymerizing prepolymer is preferable.

Photopolymerizing Monomer

A photopolymerizing monomer has a weight-average molecular weight of less than 1,000. As a photopolymerizing monomer, a multifunctional monomer having 2 photopolymerizing functional groups (namely, bifunctional), or more groups is preferable. A "weight-average molecular weight" is herein a value, which is obtained as a value reduced to polystyrene by subjecting a sample dissolved in a solvent such as tetrahydrofuran (THF) to a heretofore known gel permeation chromatography (GPC).

Examples of a 2 or more-functional monomer include trimethylolpropane tri(meth)acrylate, tripropylene glycol di(meth)acrylate, diethylene glycol di(meth)acrylate, dipropylene glycol di(meth)acrylate, pentaerythritol tri(meth) acrylate, pentaerythritol tetra(meth)acrylate, dipentaerythritol hexa(meth)acrylate, 1,6-hexanediol di(meth)acrylate, neopentyl glycol di(meth)acrylate, trimethylolpropane tri (meth)acrylate, ditrimethylolpropane tetra(meth)acrylate, dipentaerythritol penta(meth)acrylate, tripentaerythritol octa (meth)acrylate, tetrapentaerythritol deca(meth)acrylate, isocyanuric acid tri(meth)acrylate, isocyanuric acid di(meth) acrylate, polyester tri(meth)acrylate, polyester di(meth) acrylate, bisphenol di(meth)acrylate, diglycerine tetra(meth) acrylate, adamantyl di(meth)acrylate, isoboronyl di(meth) acrylate, dicyclopentane di(meth)acrylate, tricyclodecane di(meth)acrylate, and ditrimethylolpropane tetra(meth)acrylate, as well as the same modified with PO, EO, etc.

Among others, from a viewpoint of obtaining a hard coat layer having higher hardness, pentaerythritol triacrylate (PETA), dipentaerythritol hexa acrylate (DPHA), pentaerythritol tetraacrylate (PETTA), dipentaerythritol pentaacrylate (DPPA), etc. are preferable.

Photopolymerizing Oligomer

A photopolymerizing oligomer has a weight-average molecular weight not less than 1,000 but less than 10,000. As a photopolymerizing oligomer, a multifunctional oligomer having 2 or more functional groups is preferable. Examples of a multifunctional oligomer include polyester (meth)acrylate, urethane(meth)acrylate, polyester-urethane (meth)acrylate, polyether(meth)acrylate, polyol(meth)acrylate, melamine(meth)acrylate, isocyanurate(meth)acrylate, and epoxy(meth)acrylate.

Photopolymerizing Prepolymer

A photopolymerizing prepolymer has a weight-average molecular weight of 10,000 or more, which is preferably 10,000 or more and 80,000 or less, and more preferably 10,000 or more and 40,000 or less. If the weight-average molecular weight exceeds 80,000, coating suitability might be deteriorated due to high viscosity to deteriorate the appearance of an obtained electroconductive film. Examples of the multifunctional polymer include urethane(meth)acrylate, isocyanurate(meth)acrylate, polyester-urethane(meth)acrylate, and epoxy(meth)acrylate.

In polymerizing (crosslinking) a photopolymerizing compound, a polymerization initiator, etc. may be used. A polymerization initiator is a component, which is degraded by irradiation with light to generate a radical, and initiates or progresses polymerization (crosslinking) of a photopolymerizing compound.

There is no particular restriction on the polymerization initiator, insofar as it can release by irradiation with light a substance, which initiates radical polymerization. As the polymerization initiator, those publicly known may be used without particular restriction, and specific examples thereof include acetophenones, benzophenones, Michler's benzoyl benzoate, α-amyloxime ester, thioxanthones, propiophenones, benzyls, benzoins, and acyl phosphine oxides. It is preferably used together with a light sensitizer, and examples thereof include n-butylamine, triethylamine, and poly-n-butyl phosphine.

As the polymerization initiator, in the case where the binder resin is a resin system containing a radical polymerizable unsaturated group, it is preferable that acetophenones, benzophenones, thioxanthones, benzoin, benzoin methyl ether, etc. are used singly or in a combination.

The solvent drying type resin is a resin such as a thermoplastic resin, which builds a coating layer by simple evaporation of a solvent added for adjusting the solid content during coating. If a solvent drying type resin is added, when the hard coat layers 24, 28 are formed, a coating layer defect on a surface coated with a coating liquid can be prevented effectively. There is no particular restriction on the solvent drying type resin, and the thermoplastic resin can be generally used.

Examples of the thermoplastic resin include a styrenic resin, a (meth)acrylic resin, a vinyl acetate resin, a vinyl ether resin, a halogen containing resin, an alicyclic olefin resin, a polycarbonate resin, a polyester resin, a polyamide resin, a cellulose derivative, and a silicone resin, rubber, or elastomer.

The thermoplastic resin is preferably amorphous and soluble in an organic solvent (especially a common solvent, which can dissolve a plurality of polymers or curable compounds). Especially, a styrenic resin, a (meth)acrylic resin, an alicyclic olefin resin, a polyester resin, and a cellulose derivative (cellulose esters, etc.) are preferable from viewpoints of transparency and weather resistance.

There is no particular restriction on the thermosetting resin, and examples thereof include a phenolic resin, a urea resin, a diallyl phthalate resin, a melamine resin, a guanamine resin, an unsaturated polyester resin, a polyurethane resin, an epoxy resin, an amino alkyd resin, a melamine-urea cocondensation resin, a silicone resin, and a polysiloxane resin.

The hard coat layers 24, 28 can be formed by coating a composition for a hard coat layer containing the photopolymerizing compound on the surface of the light transmissive base material 20, and after drying, by irradiating the composition for a hard coat layer in a form of coated film with light such as ultraviolet light to polymerize (crosslink) the photopolymerizing compound.

To the composition for a hard coat layer, if necessary in addition to the photopolymerizing compound, a solvent, and a polymerization initiator may be added. Further, in accordance with an intended purpose, such as to increase the hardness of the hard coat layer, to suppress curing shrinkage, and to regulate the refractive index, a dispersing agent, a surfactant, an antistatic agent, a silane coupling agent, a thickener, a coloration inhibitor, a colorant (pigment, dyestuff), a defoaming agent, a leveling agent, a flame retardant, a UV absorber, a tackifier, a polymerization inhibitor, an antioxidant, a surface modification agent, and a lubricant, which have been heretofore known, may be added to a composition for hard coat layer.

Examples of a coating process of a composition for a hard coat layer include publicly known coating processes, such as a spin coating, a dipping process, a spraying process, a slide-coating process, a bar coating process, a roll coating process, a gravure coating process, and a die coating process.

When ultraviolet light is used as light for curing a composition for a hard coat layer, ultraviolet light emitted from an ultrahigh pressure mercury lamp, a high pressure mercury lamp, a low-pressure mercury lamp, a carbon arc, a xenon arc, a metal halide lamp, etc. can be applied. As for an ultraviolet light wavelength, a wavelength range of 190 to 380 nm is applicable. Specific examples of an electron beam source include various electron beam accelerators, such as a Cockcroft-Walton type, a Van de Graaff type, a resonance transformer type, an insulated core transformer type, a linear type, a dynamitron type, and a high-frequency type.

(High Refractive Index Layer)

The refractive index of the high refractive index layer 25 is preferably 1.55 or more and 1.75 or less. The lower limit of the refractive index of the high refractive index layer 25 is preferably 1.58 or more, and the upper limit of the refractive index of the high refractive index layer 25 is preferably 1.70 or less. When high refractive index layers are formed on both sides of a light transmissive base material, the respective refractive indices of the high refractive index layers are preferably within the above range, however, are not necessarily required to be identical. The refractive index of the high refractive index layer 25 can be measured by a method similar to that for the refractive index of the easily adhesive layers 23, 27. The refractive index difference between the hard coat layer 24 and the high refractive index layer 25 is preferably 0.05 or more and 0.20 or less from a viewpoint of suppression of variation of hue.

The film thickness of the high refractive index layer 25 is preferably 20 nm or more and 100 nm or less. The film thickness of the high refractive index layer 25 can be determined by cross-sectional microscopic observation. The lower limit of the film thickness of the high refractive index layer 25 is more preferably 30 nm or more, and the upper limit of the film thickness of the high refractive index layer 25 is more preferably 70 nm or less. When high refractive index layers are formed on both sides of a light transmissive base material, the respective film thicknesses of the high refractive index layers are preferably within the above range, however, are not necessarily required to be identical.

The high refractive index layer 25 and the low refractive index layer 26 can function as an index matching layer, which reduces difference in light transmittance and reflectance between a region provided with a transparent electroconductive layer and a region not provided with a transparent electroconductive layer.

There is no particular restriction on the high refractive index layer 25, insofar as the refractive index and the film thickness thereof are as described above, and the high refractive index layer 25 may be constituted, for example, with a high refractive index particle and a binder resin.

As the high refractive index particle, for example, a metallic oxide fine particle may be used. Specific examples of a metallic oxide fine particle include titanium oxide ($TiO_2$, refractive index: 2.3 to 2.7), niobium oxide ($Nb_2O_5$, refractive index: 2.33), zirconium oxide ($ZrO_2$, refractive index: 2.10), antimony oxide ($Sb_2O_5$, refractive index: 2.04), tin oxide ($SnO_2$, refractive index: 2.00), tin-doped indium oxide (ITO, refractive index: 1.95 to 2.00), cerium oxide ($CeO_2$, refractive index: 1.95), aluminum doped zinc oxide (AZO, refractive index: 1.90 to 2.00), gallium doped zinc oxide (GZO, refractive index: 1.90 to 2.00), zinc antimonate ($ZnSb_2O_6$, refractive index: 1.90 to 2.00), zinc oxide (ZnO, refractive index: 1.90), yttrium oxide ($Y_2O_3$, refractive index: 1.87), antimony doped tin oxide (ATO, refractive index: 1.75 to 1.85), and phosphorus doped tin oxide (PTO, refractive index: 1.75 to 1.85). Among them, zirconium oxide is preferable from viewpoints of higher refractive index and cost.

Although there is no particular restriction on a binder resin contained in the high refractive index layer 25 and a thermoplastic resin can be used, a thermosetting resin or a polymer (crosslinked substance) of a photopolymerizing compound is preferable from a viewpoint of higher surface hardness, and among others a polymer of a photopolymerizing compound is more preferable.

Examples of the thermosetting resin include resins, such as an acrylic resin, a urethane resin, a phenolic resin, a urea melamine resin, an epoxy resin, an unsaturated polyester resin, and a silicone resin. A curing agent may be used for curing a thermosetting resin.

There is no particular restriction on the photopolymerizing compound, and a photopolymerizing monomer, oligomer, and polymer can be used. Examples of a monofunctional photopolymerizing monomer include ethyl(meth)acrylate, ethylhexyl(meth)acrylate, styrene, methylstyrene, and N-vinylpyrrolidone. Examples of a 2-, or higher functional photopolymerizing monomer include polymethylolpropane tri(meth)acrylate, hexanediol(meth)acrylate, tripropylene glycol di(meth)acrylate, diethyleneglycol di(meth)acrylate, pentaerythritol tri(meth)acrylate, pentaerythritol tetra(meth)acrylate, dipentaerythritol penta(meth)acrylate, dipentaerythritol hexa(meth)acrylate, 1,6-hexanediol di(meth)acrylate, and neopentyl glycol di(meth)acrylate, as well as compounds obtained by modification of the above compounds with ethylene oxide, polyethylene oxide, or the like.

The compounds may introduce an aromatic ring, a halogen atom other than fluorine, sulfur, nitrogen, a phosphorus atom, etc. to regulate the refractive index higher. Further, in addition to the above compounds, a polyester resin, a polyether resin, an acrylic resin, an epoxy resin, a urethane resin, an alkyd resin, a spiroacetal resin, a polybutadiene resin, and a polythiol-polyene resin, which have an unsaturated double bond and a relatively low molecular weight, may be also used. A polymerization initiator described in the section of the hard coat layer may be used for polymerizing (crosslinking) a photopolymerizing compound.

The high refractive index layer 25 can be formed, for example, by a process similar to the formation process for the hard coat layer 24. Specifically, a composition for the high refractive index layer containing at least a high refractive index fine particle and a photopolymerizing compound is firstly coated on a surface of the hard coat layer 24. Next, the composition for the high refractive index layer in a film form is dried. Then the composition for the high refractive index layer in a film form is irradiated with light such as ultraviolet light for polymerizing (crosslinking) the photopolymerizing compound to form the high refractive index layer 25.

(Low Refractive Index Layer)

The low refractive index layer 26 is a layer having a refractive index lower than the high refractive index layer 25. The refractive index of the low refractive index layer 26 is preferably not less than 1.35 but less than 1.55. The lower limit of the refractive index of the low refractive index layer 26 is more preferably 1.40 or more, and the upper limit of the refractive index of the low refractive index layer 26 is more preferably 1.51 or less. The refractive index of the low refractive index layer 26 can be measured by a method similar to that for the refractive index of the easily adhesive layer 23. The refractive index difference between the high refractive index layer 25 and the low refractive index layer 26 is preferably 0.10 or more and 0.30 or less from a viewpoint of suppression of variation of hue.

The film thickness of a low refractive index layer 26 is preferably 3 nm or more and 100 nm or less. The lower limit of the film thickness of the low refractive index layer 26 is more preferably 5 nm or more, and further preferably 10 nm or more. The upper limit of the film thickness of the low refractive index layer 26 is more preferably 80 nm or less, further preferably 60 nm or less, and still further preferably 45 nm or less. The film thickness of the low refractive index layer can be measured by a cross-sectional microscopic observation. When low refractive index layers are formed on both sides of a light transmissive base material, the respective film thicknesses of the low refractive index layers 26 are preferably within the above range, however, are not necessarily required to be identical.

There is no particular restriction on the low refractive index layer 26, insofar as the refractive index and the film thickness thereof are as described above, and the low refractive index layer 26 may be composed, for example, of a low refractive index particle and a binder resin, or of a low refractive index resin.

Examples of the low refractive index particle include a solid or hollow particle composed of silica, or magnesium fluoride. Among them, a hollow silica particle is preferable, and such a hollow silica particle can be produced, for example, by a production process described in Examples in Japanese Unexamined Patent Application Publication No. 2005-099778.

As the low refractive index fine particle, use of a reactive silica fine particle having a reactive functional group on a silica surface is preferably used. As the reactive functional group, a photopolymerizing functional group is preferable. Such a reactive silica fine particle can be prepared by a surface treatment of a silica fine particle with a silane coupling agent, etc. Examples of a process for treating a surface of a silica fine particle with a silane coupling agent include a dry process, in which a silane coupling agent is sprayed on a silica fine particle, and a wet process, in which a silica fine particle is dispersed in a solvent and a silane coupling agent is added and reacted therein.

The binder resin included in the low refractive index layer 26 may be similar to the binder resin included in the high refractive index layer 25. However in this case, a resin containing a fluorine atom, or a material with a low refractive index such as an organopolysiloxane may be mixed with a binder resin.

Examples of the low refractive index resin include a resin having introduced a fluorine atom, and a low refractive index such as organopolysiloxane.

The low refractive index layer 26 can be formed, for example, by a process similar to the formation process for the hard coat layer 24. Specifically, a composition for the low refractive index layer containing at least a low refractive index fine particle and a photopolymerizing compound is firstly coated on a surface of the high refractive index layer 25. Next, the composition for the low refractive index layer in a film form is dried. Then the composition for the low refractive index layer in the film form is irradiated with light such as ultraviolet light for polymerizing (crosslinking) the photopolymerizing compound to form the low refractive index layer 26.

The refractive index and the film thickness of a low refractive index layer, etc. of a base material film have been heretofore decided mainly from a viewpoint of reducing a difference (reflectance difference) between the reflectance of the base material film and the reflectance of a transparent electroconductive layer to be layered on the base material film, and the variation of hue, when the base material film is viewed from various angles, has not received any attention. On the other hand, the human eye is more sensitive to a change in hue rather than to the reflectance difference, and when the refractive index difference between a high refractive index layer and a low refractive index layer is increased in order to decrease the reflectance difference between a base material film and a transparent electroconductive layer, the variation of hue tends to expand. As the results of diligent studies by the present inventors it has been found that the variation of hue can be reduced by adjusting the a* value and b* value of a base material film. Specifically, it has been found through experiments that, when the base material film is irradiated with light from a surface side of the functional layer while an incidence angle is varied every five degrees in a range of 5° or more and 75° or less, assuming that a normal direction of a surface of the base material film is 0°, to determine a* and b* values in a L*a*b* color system from reflected light toward each regular reflection direction, if the variation of the a* values is 1.0 or less and the variation of the b* values is 3.0 or less, an observer does not recognize variation of hue, even when he/she views the base material film from various directions.

According to the present Embodiment, when the base material film 11 is irradiated with light from the surface side of the functional layer 21 while an incidence angle is varied every five degrees in a range of 5° or more and 75° or less, assuming that a normal direction of a surface of the base material film 11 is 0°, to determine a* and b* values in a L*a*b* color system from reflected light toward each regular reflection direction, the variation of the a* values is 1.0 or less, and the variation of the b* values is 3.0 or less, and therefore the variation of hue when the base material film 11 is viewed from various directions can be suppressed.

Further as the results of diligent studies by the present inventors it has been found that, when a high refractive index layer with a refractive index of 1.55 or more and 1.75 or less and a film thickness of 20 nm or more and 100 nm or less, and a low refractive index layer with a refractive index of not less than 1.35 but less than 1.55 and a film thickness of 3 nm or more and 100 nm or less are layered on a light transmissive base material in the order mentioned, the variation range of a* values of the base material film can be made to 1.0 or less, and the variation range of b* values can be made to 3.0 or less. Although the base material film 11 comprising the high refractive index layer 25 with the above refractive index and film thickness, and the low refractive index layer 26 with the above refractive index and film thickness exhibits a reflectance difference with a transparent electroconductive layer within an allowable range, it can be never adopted from a conventional viewpoint of reduction of a reflectance difference between a base material film and a transparent electroconductive layer, because compared to a conventional base material film, the reflectance difference with a transparent electroconductive layer becomes larger. Therefore, the effect exhibited by realizing the refractive index and film thickness of the high refractive index layer 25, and the low refractive index layer 26 within the above ranges, and the a* value and b* value within the above ranges is a remarkable effect beyond a foreseeable range based on the technology level of conventional base material films.

<Transparent Electroconductive Layer>

A transparent electroconductive layer is provided on a base material film, and patterned. In the present Embodiment, the transparent electroconductive layer 12 is formed on one side of the base material film 11. As shown in FIG. 1, a transparent electroconductive layer 12 is provided with sensor portions 12A placed in a rectangular active area A1, which is a region where a touch position can be detected, and terminal portions 12B placed in a non-active area A2, which is a region adjacent to the active area A1 and surrounding the active area A1 on every side.

The sensor portions 12A are placed on a surface of the base material film 11 in a predetermined pattern. Specifically, the sensor portions 12A are configured as linear electroconductive layers aligned in one direction along a film surface of the base material film 11

Each linear electroconductive layer constituting the sensor portions 12A extending linearly in a direction crossing the alignment direction (one direction described above). In FIG. 1 sensor portions 12A extend linearly in a direction orthogonal (other direction described above) to the alignment direction (one direction described above).

The sensor portion 12A includes a line portion 12C extending linearly, and a bulging portion 12D bulging out from the line portion 12C. In FIG. 1 the line portion 12C extends linearly in a direction crossing the alignment direction of the sensor portions 12A. The bulging portion 12D is a portion bulging out from the line portion 12C along the film surface of the base material film 11. Consequently, the width of each sensor portion 12A is larger at portions where the bulging portions 12D are provided. In the present Embodiment, the bulging portion 12D has a nearly square contour in planar view.

As described above, the transparent electroconductive layer 12 has the terminal portions 12B connected with such the sensor portions 12A. With respect to each sensor portions 12A, 1 or 2 terminal portions 12B are provided depending on a detection method for a contact position. Each terminal portion 12B extends linearly from an edge of a corresponding sensor portion 12A. In the present Embodiment the terminal portions 12B and the sensor portions 12A are formed in one body out of the same material.

The refractive index of the transparent electroconductive layer 12 (sensor portion 12A and terminal portion 12B) is preferably 1.85 or more and 2.30 or less. The lower limit of the refractive index of the transparent electroconductive layer 12 is preferably 1.90 or higher, and the upper limit of the refractive index of the transparent electroconductive layer 12 is preferably 2.20 or lower. The refractive index of the transparent electroconductive layer 12 can be measured by a method similar to that for the refractive index of the easily adhesive layer 23 described above.

The film thickness of the transparent electroconductive layer 12 is preferably 15 nm or more and 50 nm or less. The lower limit of the film thickness of the transparent electroconductive layer 12 is more preferably 20 nm or more, and the upper limit of the film thickness of the transparent electroconductive layer 12 is more preferably 45 nm or less.

The transparent electroconductive layer 12 is a layer containing, for example, an inorganic material for a transparent electroconductive layer, an organic material for a transparent electroconductive layer, or a mixed material of an inorganic material for a transparent electroconductive layer and an organic material for a transparent electroconductive layer. Examples of the inorganic material for a transparent electroconductive layer include metallic oxides, such as tin-doped indium oxide (ITO), antimony doped tin oxide (ATO), zinc oxide, indium oxide ($In_2O_3$), aluminum doped zinc oxide (AZO), gallium doped zinc oxide (GZO), tin oxide, a zinc oxide-tin oxide system, an indium oxide-tin oxide system, and a zinc oxide-indium oxide-magnesium oxide system, and a carbon nanotube. Among them tin-doped indium oxide (ITO) is preferable as the inorganic material for a transparent electroconductive layer from viewpoints of transparency and low resistance of a transparent electroconductive layer. Examples of the organic material for a transparent electroconductive layer include an electroconductive polymer.

<Lead-Out Electrode>

The lead-out electrode is for conducting an electrical signal from the sensor portion efficiently to a detection control section (not illustrated), and, as described above, the lead-out electrode 13 is electrically connected with the transparent electroconductive layer 12. The lead-out electrode 13 is preferably provided only at a partial portion of the transparent electroconductive layer 12. In the present Embodiment, the lead-out electrode 13 is placed on a partial portion of the terminal portion 12B of the transparent electroconductive layer 12. In other words, the lead-out electrodes 13 are placed in the non-active area A2.

In FIG. 1 the terminal portion 12B is formed linear. While, a lead-out electrode 13 extends linearly on a part of the terminal portion 12B formed linear excluding a part near a connection with the sensor portion 12A, along the pattern of the terminal portion 12B.

The lead-out electrode 13 shown in FIG. 3 is formed only on the terminal portion 12B and not in contact with the base material film 11. The width of the lead-out electrode 13 is the same as or slightly narrower than the width of the terminal portion 12B.

The lead-out electrode 13 together with the terminal portion 12B constitutes a lead-out wire 29 for connecting electrically the sensor portion 12A with a detection control section (not illustrated). Since the lead-out wire includes not only the terminal portion 12B of the transparent electroconductive layer 12 with low electric conductivity, but also the lead-out electrode 13 with high electric conductivity, the wire width of the lead-out wire 29 can be made thin, and therefore the occupied area for the lead-out wire 29, namely the area of the non-active area A2, can be restricted to a small area.

Since the lead-out electrode is placed in the non-active area A2, the lead-out electrode is not required to be composed of a translucent material, and may be composed of light-shading property and electrically conductive material. The lead-out electrode is preferably composed of a material having higher electric conductivity than a constitutional material for a transparent electroconductive layer (for example, a metallic material, such as aluminum, chromium, copper, molybdenum, and silver, which has remarkably higher electric conductivity than a transparent electroconductive layer of ITO, etc.). The lead-out electrode 13 is composed of a material having opacity and electrical conductivity.

For the sake of a better design and enlargement of a display unit of a touch panel device, reduction of an area surrounding a display region, referred to as a frame area, is now demanded. In line with the above, reduction of a non-active area of a touch panel sensor is asked for. In this connection, when enlargement of the area of a touch panel device is intended, the number of wires also increases, and therefore for reducing the area of the non-active area, wiring intervals are required to be reduced further. However, when a lead-out electrode is formed by a screen printing process, the lead-out electrode flows over a transparent electroconductive layer to a lateral of the transparent electroconductive layer, and therefore smaller wire intervals can be hardly attained from a viewpoint of secured insulation. In the present Embodiment the lead-out electrode 13 is localized on the terminal portion 12B of the transparent electroconductive layer 12 without extending to a side are of the terminal portion 12B as shown in FIG. 3. Therefore compared to a case where a lead-out electrode extends to a side area of a terminal portion, the possibility of electromigration can be decreased remarkably. By this the wire width of the lead-out wire 29 as a whole constituted with the lead-out electrode 13 and the terminal portion 12B can be reduced. As the result, the lead-out wires 29 can be arranged with reduced intervals, and therefore the area occupied by the lead-out wires 29, namely the area of the non-active area A2 can be reduced.

The lead-out electrode 13 is not in contact with the base material film 11, which exhibits only low adherence, and bonded only to the transparent electroconductive layer 12, which can exhibit high adherence. Therefore, even when the electroconductive film 10 is deformed during usage, generation of an origin initiating peeling of the lead-out electrode 13 from the electroconductive film 10 can be suppressed. Further, since the terminal portion 12B of the transparent electroconductive layer 12 is not covered laterally by the lead-out electrode 13, the terminal portion 12B is constrained only weakly by the lead-out electrode 13, and therefore during deformation of an electroconductive film, the terminal portion 12B can deform following the deformation of the base material film 11. Therefore, the lead-out electrode 13 can effectively suppress detachment of the terminal portion 12B from the base material film 11 together with the transparent electroconductive layer 12. As the result, the reliability of the detection function of a touch panel can be improved remarkably.

<Process for Producing Electroconductive Film>

Figure 5A:
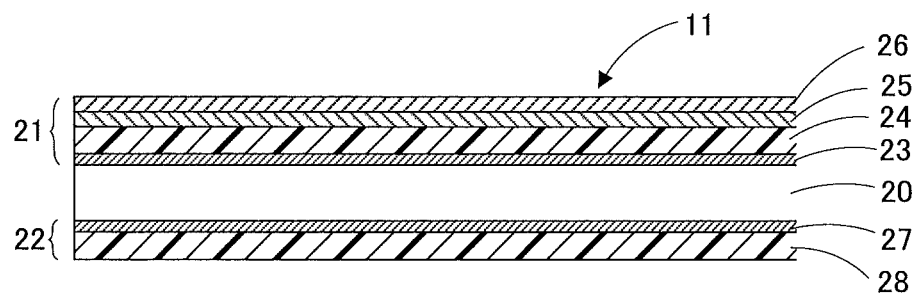
FIG. 5A is a schematic diagram showing a process step for producing an electroconductive film.
Figure 5B:
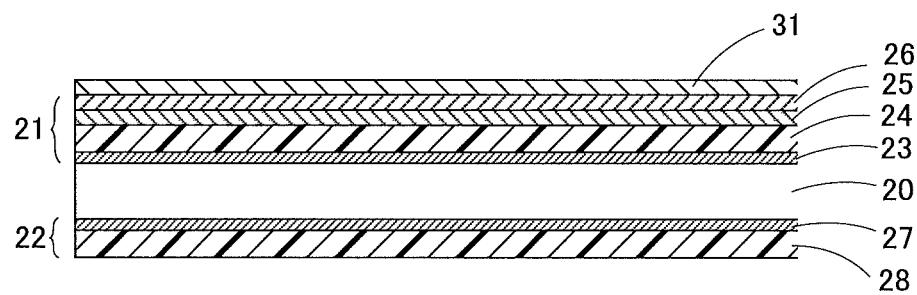
FIG. 5B is a schematic diagram showing a process step for producing an electroconductive film.

A process for producing the electroconductive film 10 will be described below in detail. Firstly, the base material film 11 is prepared (FIG. 5A). After preparation of the base material film 11, a transparent electroconductive layer 31 is formed on a surface of the base material film 11 by a sputtering process, etc. (FIG. 5B). Examples of a material for forming a transparent electroconductive layer include those similar to constitutional materials for a transparent electroconductive layer.

Figure 5C:
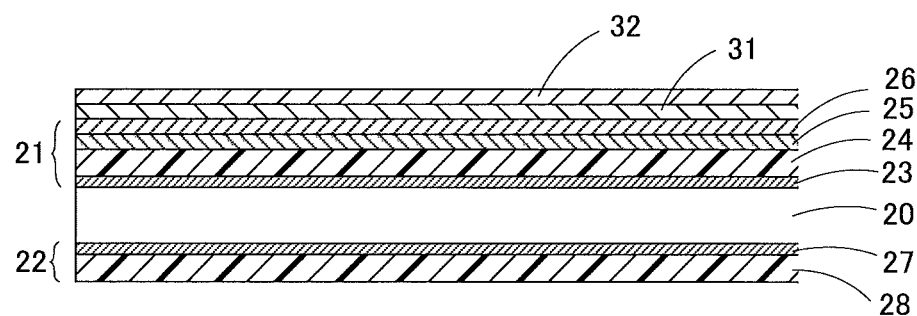
FIG. 5C is a schematic diagram showing a process step for producing an electroconductive film.

After formation of the transparent electroconductive layer 31 on the surface of the base material film 11, a light-shading electroconductive layer 32 having light-shading property and electrical conductivity is formed on the transparent electroconductive layer 31 by a sputtering process, etc. (FIG. 5C). Examples of a material for forming the light-shading electroconductive layer 32 include those similar to constitutional materials for the lead-out electrode 13.

Figure 6A:
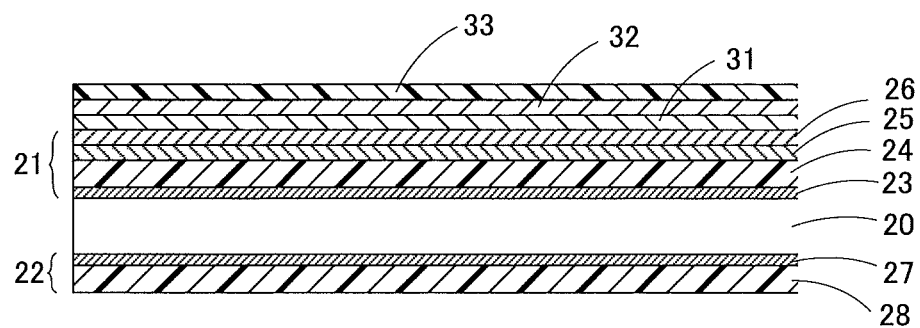
FIG. 6A is a schematic diagram showing a process step for producing an electroconductive film.

After formation of the light-shading electroconductive layer 32 on the transparent electroconductive layer 31, a photosensitive layer 33 is formed on the light-shading electroconductive layer 32 (FIG. 6A). A photosensitive layer 33 has photosensitivity to light in a specific wavelength range, for example, ultraviolet light. A photosensitive layer 33 can be formed by coating a photosensitive material using a coater on the light-shading electroconductive layer 32.

Figure 6B:
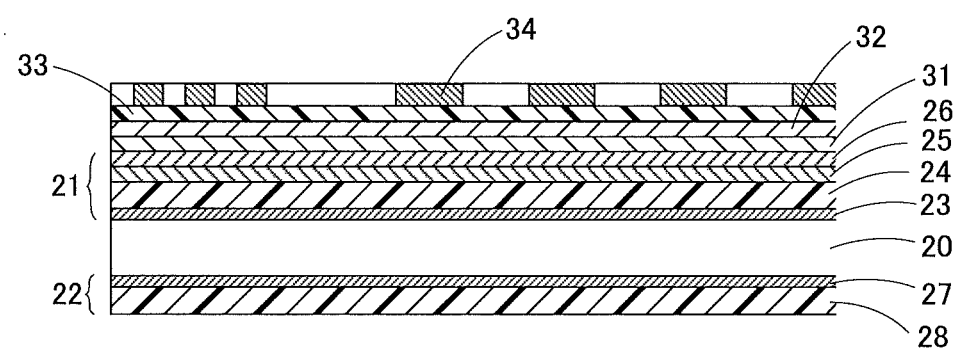
FIG. 6B is a schematic diagram showing a process step for producing an electroconductive film.

Then a mask 34 is placed on the photosensitive layer 33 (FIG. 6B). The mask 34 has a pattern corresponding to a pattern of the transparent electroconductive layer 12 to be formed.

Figure 6C:
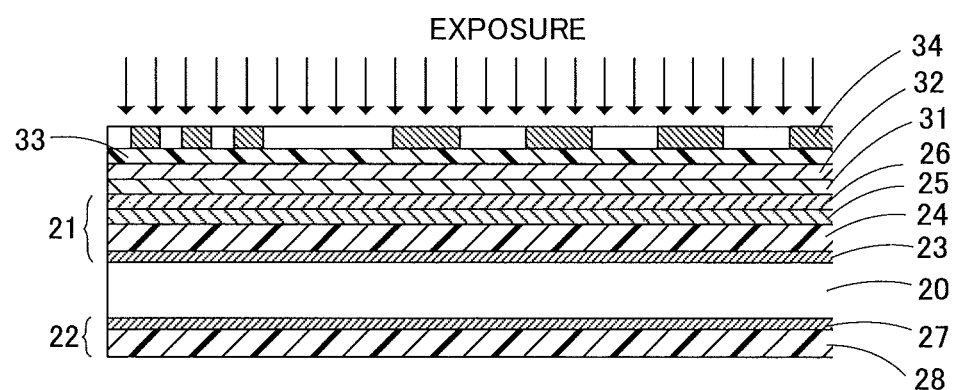
FIG. 6C is a schematic diagram showing a process step for producing an electroconductive film.

In a state where the mask 34 is placed on the photosensitive layer 33, the photosensitive layer 33 is exposed to irradiation with light corresponding to the photosensitivity of the photosensitive layer 33 (for example, ultraviolet light) through the mask 34 (FIG. 6C). The photosensitive layer 33 shown in FIG. 6C is a positive-type photosensitive layer. Therefore, such a part of the photosensitive layer 33, as is removed by etching for forming the transparent electroconductive layer 12, is irradiated with light. Since the light-shading electroconductive layer 32 is present under the photosensitive layer 33, the light from an exposing source passes a photosensitive layer 33 but does not pass the light-shading electroconductive layer 32 without reaching the transparent electroconductive layer 31. As the result, in the exposure step the photosensitive layer 33 can be exposed accurately in an intended pattern.

Figure 7A:
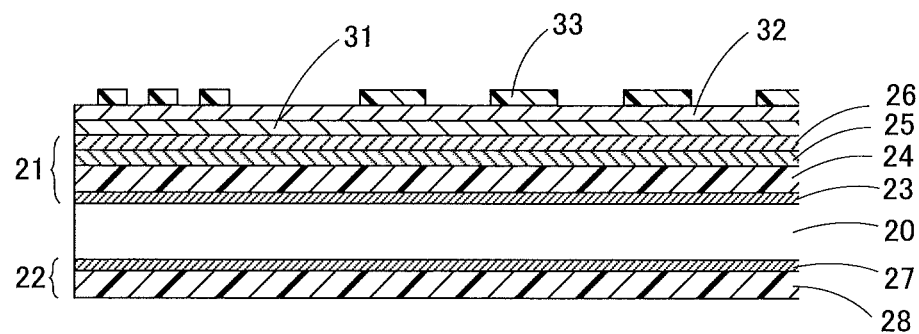
FIG. 7A is a schematic diagram showing a process step for producing an electroconductive film.

After exposure of the photosensitive layer 33, the photosensitive layer 33 is developed (FIG. 7A). Specifically, a developing solution corresponding to the photosensitive layer 33 is prepared, and the photosensitive layer 33 is developed by using the developing solution. By this, a part of the photosensitive layer 33, which has been irradiated with light emitted from an exposing source without being shaded by a mask 34 is removed to leave the photosensitive layer 33 in a predetermined pattern.

Figure 7B:
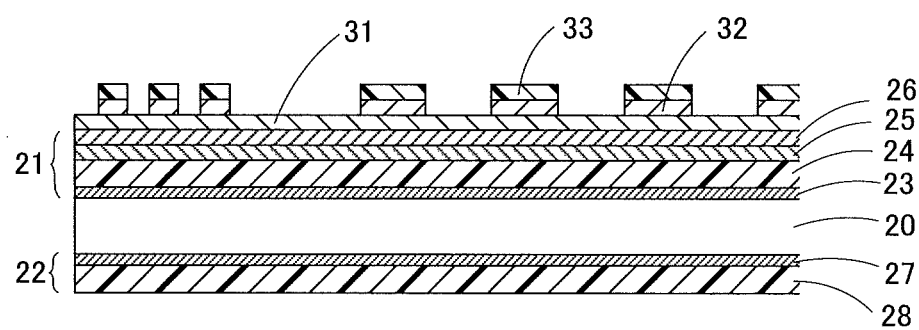
FIG. 7B is a schematic diagram showing a process step for producing an electroconductive film.

Then, the light-shading electroconductive layer 32 is etched using the patterned photosensitive layer 33 as a mask (FIG. 7B). By this etching, the light-shading electroconductive layer 32 is patterned in substantially the same pattern as the photosensitive layer 33. If, for example, the light-shading electroconductive layer 32 is made of aluminum or molybdenum, an etching solution composed of phosphoric acid, nitric acid, acetic acid, and water at a mixing ratio of 5:5:5:1 may be used. If, the light-shading electroconductive layer 32 is made of chromium, an etching solution composed of cerium ammonium nitrate, perchloric acid, and water at a mixing ratio of 17:4:70 may be used. Further, if the light-shading electroconductive layer is made of silver, an etching solution composed of phosphoric acid, nitric acid, acetic acid, and water at a mixing ratio of 4:1:4:4 may be used.

Figure 7C:
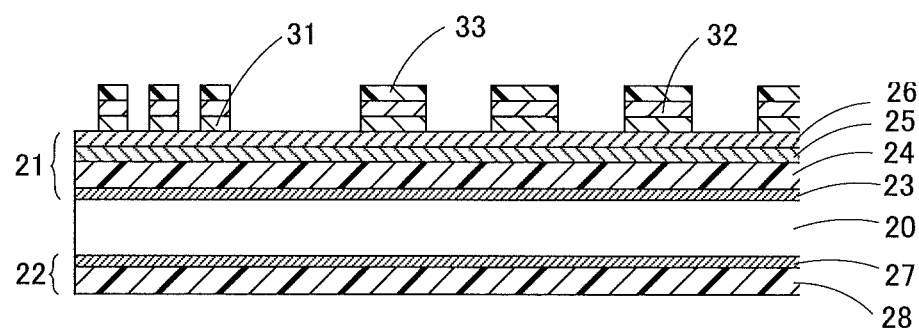
FIG. 7C is a schematic diagram showing a process step for producing an electroconductive film.

After etching the light-shading electroconductive layer 32, using the patterned photosensitive layer 33 and the light-shading electroconductive layer 32 as a mask, the transparent electroconductive layer 31 is etched (FIG. 7C). By this etching, the transparent electroconductive layer 31 is patterned in substantially the same pattern as the photosensitive layer 33 and the light-shading electroconductive layer 32. If the transparent electroconductive layer 31 is made of ITO, ferric chloride may be used for an etching solution.

Figure 8A:
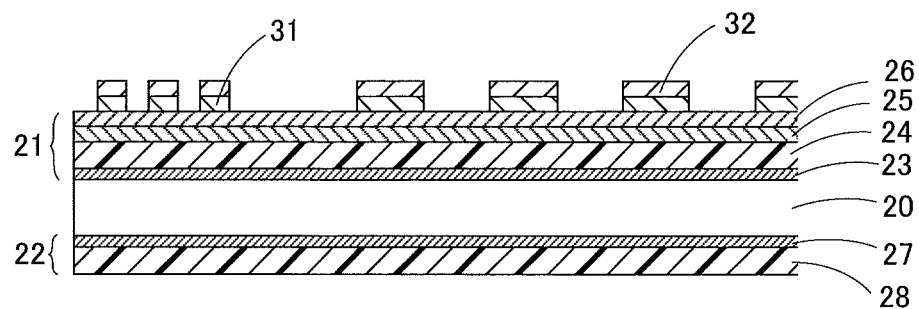
FIG. 8A is a schematic diagram showing a process step for producing an electroconductive film.

After etching the transparent electroconductive layer 31, the residual photosensitive layer 33 on the light-shading electroconductive layer 32 is removed (FIG. 8A). By the removal of the photosensitive layer 33, a patterned light-shading electroconductive layer is exposed. The photosensitive layer 33 can be removed, for example, with an alkaline liquid such as a 2% potassium hydroxide solution.

Figure 8B:
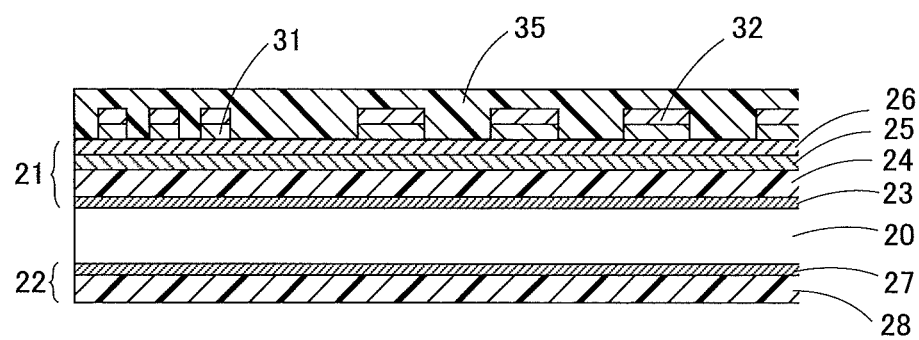
FIG. 8B is a schematic diagram showing a process step for producing an electroconductive film.

Next, a photosensitive layer 35 is formed on the light-shading electroconductive layer 32 so as to cover the light-shading electroconductive layer 32 (FIG. 8B). The photosensitive layer 35 is sensitive to light in a specific wavelength range, for example ultraviolet light, identically with the photosensitive layer 33. Further, the photosensitive layer 35 can be formed identically with the photosensitive layer 33 by coating a photosensitive material with a coater.

Figure 8C:
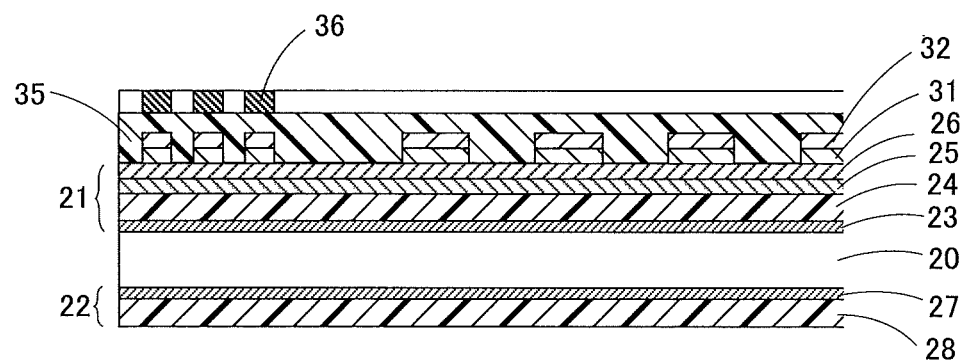
FIG. 8C is a schematic diagram showing a process step for producing an electroconductive film.

Next, a mask 36 is placed on the photosensitive layer 35 (FIG. 8C). The mask 36 has a pattern corresponding to a part to be removed for forming the lead-out electrode 13. The mask 36 has a pattern formed corresponding to the active area A1, more precisely has a translucent region formed slightly larger than the active area A1.

Figure 9A:
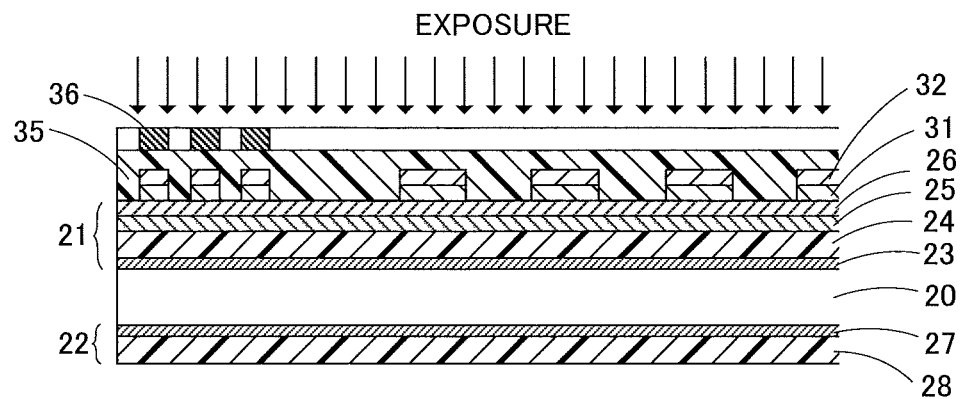
FIG. 9A is a schematic diagram showing a process step for producing an electroconductive film.

In a state, where the mask 36 is placed on the photosensitive layer 35, the photosensitive layer 35 is exposed to irradiation with light corresponding to the photosensitivity of the photosensitive layer 35 (for example, ultraviolet light) through the mask 36 (FIG. 9A). The photosensitive layer 35 shown in FIG. 9A is a positive type photosensitive layer. The mask 36 has a translucent region including the active area A1. Consequently, the active area A1 and the surroundings are irradiated with light.

Figure 9B:
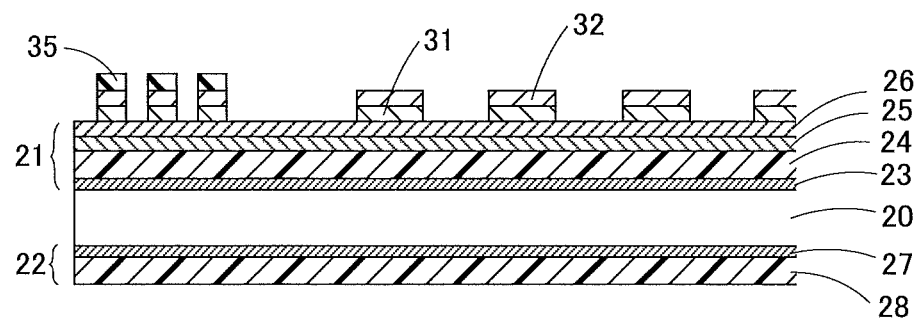
FIG. 9B is a schematic diagram showing a process step for producing an electroconductive film.

After exposing the photosensitive layer 35, the photosensitive layer 35 is developed (FIG. 9B). Specifically, a developing solution corresponding to the photosensitive layer 35 is prepared, and a photosensitive layer 35 is developed by using the developing solution. By this, the active area A1 and the surrounding regions in the photosensitive layer 35 are removed, so that only the non-active area A2 in the photosensitive layer 35 remains.

Figure 9C:
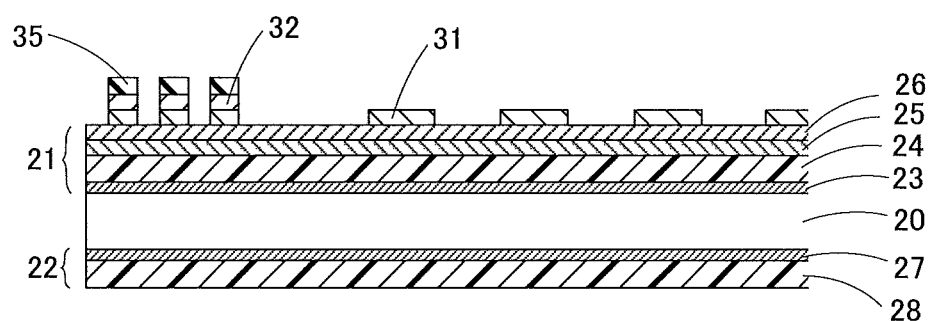
FIG. 9C is a schematic diagram showing a process step for producing an electroconductive film.

Then, the light-shading electroconductive layer 32 is etched using the patterned photosensitive layer 35 as a mask (FIG. 9C). This etching is conducted with an etching solution, which is not erosive to the light-shading electroconductive layer 32, or only weakly erosive to the transparent electroconductive layer 31, so as not to damage a pattern of the transparent electroconductive layer 31 exposed through removal of the light-shading electroconductive layer 32. In other words, an etching solution used in the process step is selected such that it can etch selectively the light-shading electroconductive layer 32. Specific examples thereof include an etching solution composed of a mixture of phosphoric acid, nitric acid, acetic acid, and water, or an etching solution based on cerium nitrate, which can be used favorably in the process step, because they can etch the light-shading electroconductive layer 32, but not the transparent electroconductive layer 31 composed of ITO, etc.

By this etching, at least a part of the patterned light-shading electroconductive layer 32 situated in the active area A1 is removed. From this, in the active area A1 only the base material film 11 and the transparent electroconductive layer 12 remain, and the active area A1 comes to have translucency over the entire region.

As described above, parts of the light-shading electroconductive layer 32 not covered by the photosensitive layer 35 are removed and the transparent electroconductive layer 31 is exposed. The exposed transparent electroconductive layer 31 is situated in the active area A1 and the surroundings thereof. The transparent electroconductive layer 31 situated in the active area A1 forms the sensor portion 12A in a predetermined pattern, and the transparent electroconductive layer 31 situated in the non-active area A2 forms the terminal portion 12B in a predetermined pattern.

Figure 10:
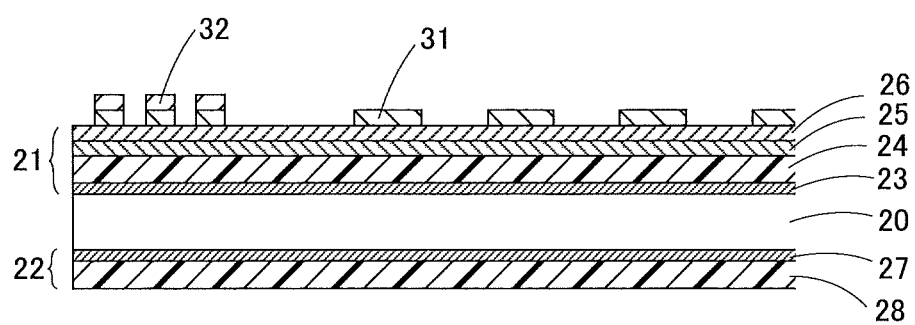
FIG. 10 is a schematic diagram showing a process step for producing an electroconductive film.

After etching the light-shading electroconductive layer 32, the photosensitive layer 35 remaining over the light-shading electroconductive layer 32 is removed (FIG. 10). After removal of the photosensitive layer 35, the patterned light-shading electroconductive layer 32 is exposed.

The exposed light-shading electroconductive layer 32 becomes the lead-out electrode 13. Further, between the formed lead-out electrode 13 and the base material film 11, the terminal portion 12B made of the transparent electroconductive layer 31 is formed. Thus, the electroconductive film 10 is obtained.

In the production process, the lead-out electrode 13 and the terminal portion 12B of the transparent electroconductive layer 12 are formed by a photolithography technology, and therefore they can be formed very accurately at a desired position and in a desired shape compared to a conventional process using a screen printing process. Consequently, the lead-out electrode 13 can be formed on only a part of the terminal portion 12B of the transparent electroconductive layer 12.

<Touch Panel Sensor>

The electroconductive film 10 can be used, for example, in a state incorporated into a touch panel sensor. A touch panel sensor 30 shown in FIG. 11 and FIG. 12 has a structure, in which 2 electroconductive films 10, 40 are layered. The electroconductive film 10 is layered on the electroconductive film 40, such that the electroconductive film 10 rather than the electroconductive film 40 is positioned closer to an observer, as shown in FIG. 11 and FIG. 12.

Similar to the electroconductive film 10, the electroconductive film 40 includes a base material film 11, a transparent electroconductive layer 41, provided on one side of the base material film 11 and patterned, and a lead-out electrode 42 provided on only a part of the transparent electroconductive layer 41, and having light-shading property and electrical conductivity. In this regard, since the base material film 11 in the electroconductive film 10, and the base material film 11 in the electroconductive film 40 are the same, the same sign is used herein. The base material film 11 in the electroconductive film 10, and the base material film 11 in the electroconductive film 40 may be different.

The electroconductive film 10 and the electroconductive film 40 are laminated through the intermediary of a transparent adhesive layer 31. Further, on the electroconductive film 10, a transparent adhesive layer 32 for bonding to a protection cover such as a cover glass is provided. Examples of the transparent adhesive layers 31, 32 include a publicly known pressure sensitive adhesive layer and an adhesive sheet.

Although in the present Embodiment, for both the electroconductive films 10 and 40, the base material film 11, in which the variation range of a* values is within 1.0 and the variation range of b* values is within 1.6, is used, it is only necessary that one of the electroconductive films 10 and 40 uses the base material film 11, and not necessary that both the electroconductive films 10 and 40 use the base material film 11. However, since the electroconductive film 10 is positioned closer than the electroconductive film 40 to an observer, the variation of hue of the electroconductive film 10 is more easily recognized by an observer than the same of the electroconductive film 40. Consequently, it is preferable to use the base material film 11, in which the variation range of a* values is within 1.0 and the variation range of b* values is within 3.0, for the electroconductive film 10 from a viewpoint of suppression of recognition of the variation of hue by an observer.

<Transparent Electroconductive Layer>

A transparent electroconductive layer 41 is formed on the other side of the base material film 11. As shown in FIG. 11, the transparent electroconductive layer 41 is provided with a sensor portion 41A placed in a rectangular active area A1, which is a region where a touch position can be detected, and terminal portions 41B placed in a non-active area A2, which is a region adjacent to the active area A1 and surrounding the active area A1 on every side.

The sensor portion 41A is arranged in a predetermined pattern different from a sensor portion 12A. Specifically, the sensor portion 41A is configured as a linear electroconductive layer aligned in another direction crossing the alignment direction of the sensor portion 12A and along a film surface of the base material film 11. In the present Embodiment, in planar view of the touch panel sensor 30 from the top, a direction, namely the alignment direction of the sensor portion 12A, and another direction, namely the alignment direction of the sensor portion 41A are crossing at a right angle.

Each linear electroconductive layer constituting the sensor portion 41A extends linearly in a direction crossing the alignment direction thereof (other direction described above). In FIG. 11 the sensor portion 41A extends linearly in a direction orthogonal (a direction described above) to the alignment direction thereof (other direction described above).

The sensor portion 41A has a structure similar to a sensor portion 12A. Namely, the sensor portion 41A includes a line portion 41C extending linearly, and a bulging portion 41D bulging out from the line portion 41C. In FIG. 11 the line portion 41C extends linearly in a direction crossing the alignment direction of the sensor portions 41A. The bulging portion 41D is a portion bulging out from the line portion 41C along a film surface of the base material film 11. Consequently, the width of each sensor portion 41A is larger at portions where the bulging portion 41D is provided. In the present Embodiment, the bulging portion 41D has a nearly square contour in planar view.

As shown in FIG. 11, when observed in the normal direction of the touch panel sensor 30 (namely, in planar view), the sensor portion 12A crosses a large number of sensor portions 41A. Further, as shown in FIG. 11, the bulging portion 12D of the sensor portion 12A is placed between two adjacent sensor portions 41A. Similarly, when observed in the normal direction of the touch panel sensor 30, the sensor portion 41A crosses a large number of sensor portions 12A. Also, the bulging portion 41D of the sensor portion 41A is placed between two adjacent sensor portions 12A. Further, in the present Embodiment the bulging portion 12D of the sensor portion 12A and the bulging portion 41D of the sensor portion 41A are arranged such that they do not overlap when observed in the normal direction of the touch panel sensor 30. In other words, the sensor portion 12A and the sensor portion 41A cross only at the line portions 12C, 41C when observed in the normal direction of the touch panel sensor 30.

As described above, the transparent electroconductive layer 41 includes, similarly as the transparent electroconductive layer 12, a terminal portion 41B connected with the sensor portion 41A. With respect to each sensor portion 41A, 1 or 2 terminal portions 41B are provided depending on a detection method for a contact position. Each terminal portion 41B extends linearly from an edge of the corresponding sensor portion 41A. In the present Embodiment the terminal portion 12B and the sensor portions 12A are formed in one body out of the same material, and the terminal portion 41B and the sensor portions 41A are formed in one body out of the same material. The transparent electroconductive layer 41 is composed of a material similar to that for the transparent electroconductive layer 12.

<Lead-Out Electrode>

The lead-out electrode 42 is electrically connected with the transparent electroconductive layer 41. In the present Embodiment, the lead-out electrode 42 is placed on a part of the terminal portion 41B of the transparent electroconductive layer 41. In other words, lead-out electrodes 42 are placed in the non-active area A2.

In FIG. 11 the terminal portion 41B is formed linear. While, the lead-out electrode 42, similarly to the lead-out electrode 13, extends linearly on a part of the terminal portion 41B formed linear excluding a part near a connection with the sensor portion 41A, along the pattern of the terminal portion 41B.

The lead-out electrode 42 is formed, similarly to the lead-out electrode 13, only on the terminal portion 41B and not in contact with the base material film 11. The width of the lead-out electrode 42 is the same or slightly narrower than the width of the terminal portion 41B.

The lead-out electrode 42 together with the terminal portion 41B constitutes a lead-out wire 43 for connecting electrically the sensor portion 41A with a detection control section. Since the lead-out wire 43 includes not only the terminal portion 41B of the transparent electroconductive layer 41 with low electric conductivity, but also the lead-out electrode 42 with high electric conductivity, the wire width of the lead-out wire 43 can be made thin, and therefore the occupied area for the lead-out wire 43, namely the area of the non-active area A2, can be restricted to a small area.

The lead-out electrode 42 is preferably composed of a material similar to that for the lead-out electrode 13. The lead-out electrode 42, similarly to the lead-out electrode 13, is placed only on a terminal portion 41B of the transparent electroconductive layer 41, and does not extend to a lateral area of the terminal portion 41B. Therefore compared to a case where a lead-out electrode extends to a side area of a terminal portion, the possibility of electromigration can be decreased remarkably. By this the wire width of the lead-out wire 43 as a whole constituted with the lead-out electrode 42 and the terminal portion 41B can be reduced. As the result, the lead-out wires 43 can be arranged with reduced intervals, and therefore the area occupied by the lead-out wires 43, namely the area of the non-active area A2 can be reduced.

The lead-out electrode 42 is not in contact with the base material film 11, which exhibits only low adherence, and bonded only to the transparent electroconductive layer 41, which exhibits high adherence. Therefore, even when the touch panel sensor 30 is deformed during usage, generation of an origin initiating peeling of the lead-out electrode 42 from a touch panel sensor 30 can be suppressed. Further, since the terminal portion 41B of the transparent electroconductive layer 41 is not covered laterally by the lead-out electrode 42, the terminal portion 41B is constrained only weakly by the lead-out electrode 42, and therefore during deformation of the touch panel sensor 30, the terminal portion 41B can deform following the deformation of the base material film 11. Therefore, the lead-out electrode 42 can effectively suppress detachment of the terminal portion 41B from the base material film 11 together with the transparent electroconductive layer 41. As the result, the reliability of the detection function of the touch panel sensor 30 can be improved remarkably.

[Second Embodiment]

Figure 13:
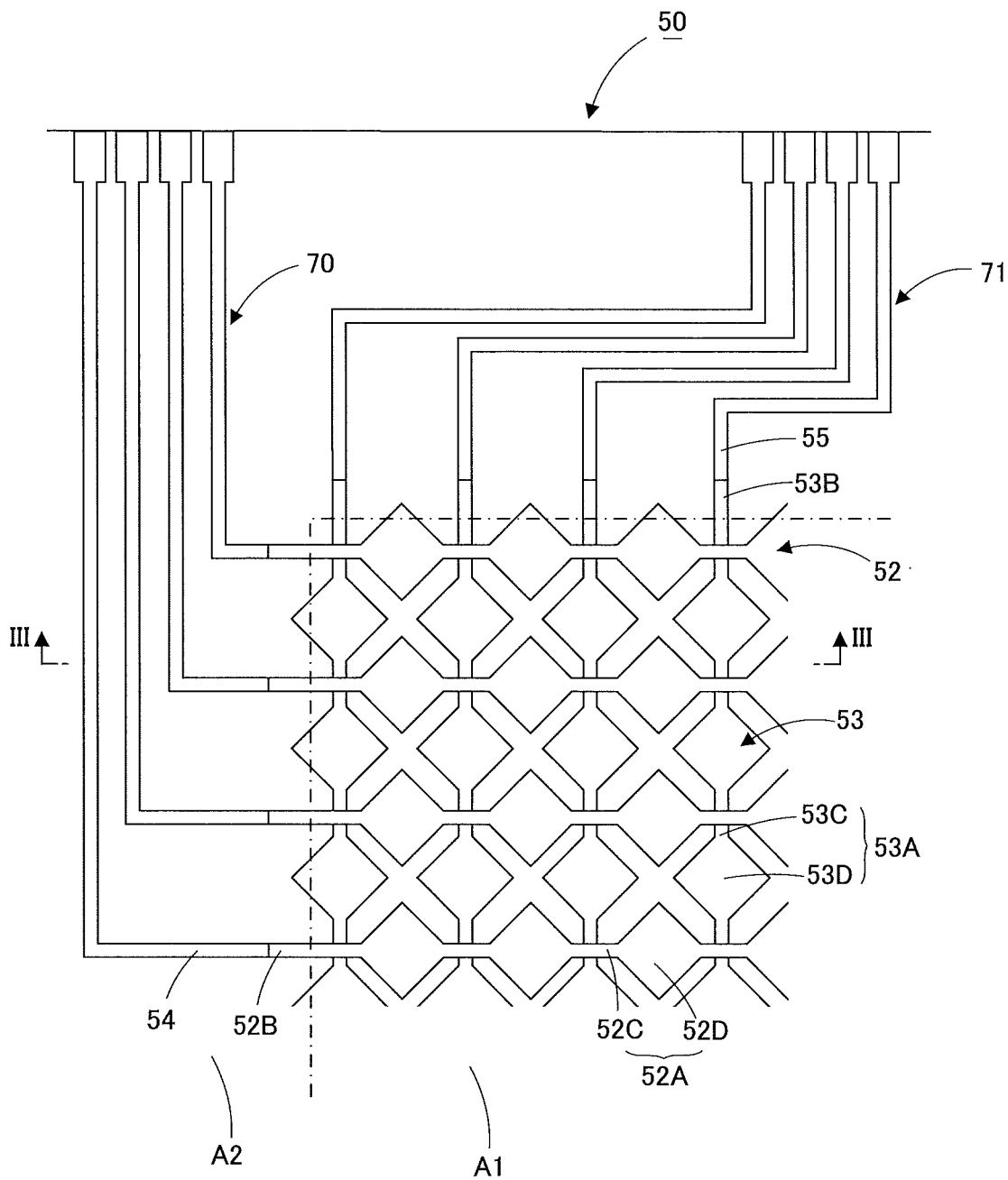
FIG. 13 is a plan view of an electroconductive film according to the second Embodiment.
Figure 14:
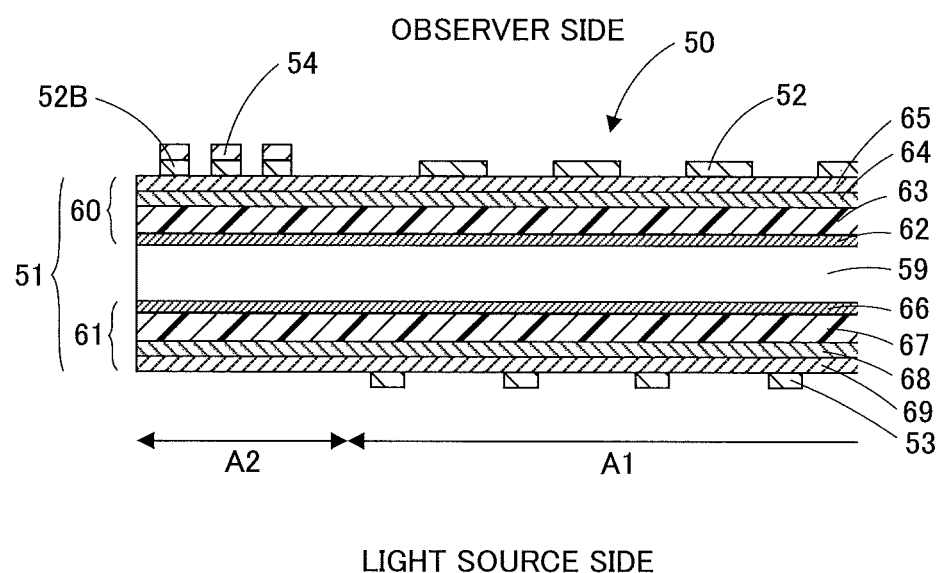
FIG. 14 is a cross-sectional view along the line III-III in FIG. 13.
Figure 15:
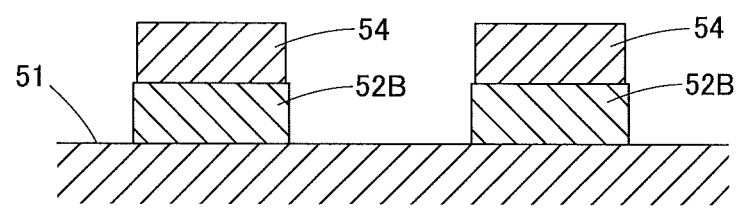
FIG. 15 is an enlarged view of a part of FIG. 14.

An electroconductive film and a touch panel sensor of the second Embodiment according to the present invention will be described below referring to drawings. FIG. 13 is a plan view of an electroconductive film according to the present Embodiment, FIG. 14 is a cross-sectional view along the line in FIG. 13, and FIG. 15 is an enlarged view of a part of FIG. 14. FIG. 16A to FIG. 21 are schematic diagrams showing process steps for producing an electroconductive film according to the present Embodiment, and FIG. 22 is a schematic structural view of a touch panel sensor according to the present Embodiment. Meanwhile, a material in the present Embodiment with the same sign as a material described in the first Embodiment means the same material as the material described in the first Embodiment, and duplicated description thereof will be omitted unless otherwise specified.

<Electroconductive Film>

An electroconductive film 50 shown in FIG. 13 and FIG. 14 is includes a base material film 51, a transparent electroconductive layer 52 provided on one surface of the base material film 51 and patterned, a transparent electroconductive layer 53, provided on the other surface of the base material film 51 and patterned, lead-out electrodes 54 electrically connected with the transparent electroconductive layer 52, and lead-out electrodes 55 electrically connected with the transparent electroconductive layer 53.

<Base Material Film>

The base material film 51 shown in FIG. 14 includes a light transmissive base material 59 and functional layers 60, 61 laminated on both sides of the light transmissive base material 59.

When the base material film 51 is irradiated with visible light from a surface side of the functional layer 60 while an incidence angle is varied every five degrees in a range of 5° or more and 75° or less, assuming that a normal direction of a surface of the base material film 50 is 0°, to determine a* and b* values in a L*a*b* color system from reflected light toward each regular reflection direction, a variation of the a* values is 1.0 or less, and a variation of the b* values is 3.0 or less with respect to the base material film 51. The variation of the a* values is preferably within 0.4, and the variation of the b* values is preferably within 1.6 and more preferably within 1.55.

A measuring method for the a* value and the b* value and a calculation method of the variation range thereof are similar to the measuring method for the a* value and the b* value and the calculation method of the variation range thereof with respect to the base material film 11 described in the first Embodiment.

The color difference ΔE*ab between the reflected light at an angle, at which the a* value and b* value are measured and the reflected light at another angle, at which the a* value and b* value are measured, is preferably 5 or less.

According to the present Embodiment, when the base material film 51 is irradiated with light from a surface side of the functional layer 60 while an incidence angle is varied every five degrees in a range of 5° or more and 75° or less, assuming that a normal direction of a surface of the base material film 51 is 0°, to determine a* and b* values in a L*a*b* color system from reflected light toward each regular reflection direction, a variation of the a* values is 1.0 or less, and a variation of the b* values is 3.0 or less, and therefore the variation of hue when the base material film 51 is viewed from various directions can be suppressed.

<Light Transmissive Base Material>

Since the light transmissive base material 59 is similar to the light transmissive base material 20, further description will be omitted.

<Functional Layer>

Although the functional layers 60, 61 are also similar to the functional layers 21, 22, in the present Embodiment, on a surface of the light transmissive base material 59, an easily adhesive layer 62, a hard coat layer 63, a high refractive index layer 64, and a low refractive index layer 65 are layered in the order mentioned, and on the other surface of the light transmissive base material 59, an easily adhesive layer 66, a hard coat layer 67, a high refractive index layer 68, and a low refractive index layer 69 are layered in the order mentioned. Since the easily adhesive layers 62, 66, the hard coat layers 63, 67, the high refractive index layers 64, 68, and the low refractive index layers 65, 69, are similar to the easily adhesive layer 23, the hard coat layer 24, the high refractive index layer 25, and the low refractive index layer 2, further description will be omitted.

<Transparent Electroconductive Layer>

The transparent electroconductive layer 52 is provided on the functional layer 60, and patterned, and the transparent electroconductive layer 53 is provided on the functional layer 61, and patterned. In FIG. 14, the transparent electroconductive layer 52 is provided on the low refractive index layer 65, and the transparent electroconductive layer 53 is provided on the low refractive index layer 69. The transparent electroconductive layer 52 includes sensor portions 53A placed in a rectangular active area A1, and terminal portions 53B placed in a non-active area A2, and the transparent electroconductive layer 53 includes sensor portions 54A placed in the active area A1, and terminal portions 54B placed in the non-active area A2.

The sensor portion 52A has a line portion 52C and a bulging portion 52D, and the sensor portion 53A has a line portion 53C and a bulging portion 53D. Since the sensor portion 52A, the line portion 52C, and the bulging portion 52D are similar to the sensor portion 12A, the line portion 12C, and the bulging portion 12D, and the sensor portion 54A, the line portion 54C, and the bulging portion 54D are similar to the sensor portion 41A, the line portion 41C, and the bulging portion 41D, further description will be omitted. Further, since the terminal portion 52B is similar to the terminal portion 12B, and the terminal portion 53B is similar to the terminal portion 41B, further description will be omitted.

<Lead-Out Electrode>

The lead-out electrode 54 is electrically connected with the transparent electroconductive layer 52, and the lead-out electrode 55 is electrically connected with the transparent electroconductive layer 53. In the present Embodiment, the lead-out electrode 54 is placed only on a part of the terminal portion 52B of the transparent electroconductive layer 52, and the lead-out electrode 55 is placed only on a part of the terminal portion 53B of the transparent electroconductive layer 53. In other words, the lead-out electrodes 54, 55 are placed in the non-active area A2.

Since the lead-out electrode 54 is similar to the lead-out electrode 13, and the lead-out electrode 55 is similar to the lead-out electrode 42, further description will be omitted.

The lead-out electrode 54 is localized on the terminal portion 52B of the transparent electroconductive layer 52 without extending to a side are of the terminal portion 52B as shown in FIG. 15. Similarly, the lead-out electrode 55 is localized on the terminal portion 53B of the transparent electroconductive layer 53 without extending to a side are of the terminal portion 53B. Therefore compared to a case where a lead-out electrode extends to a side area of a terminal portion, the possibility of electromigration can be decreased remarkably. By this the wire width of a lead-out wire 70 as a whole constituted with the lead-out electrode 54 and the terminal portion 52B can be reduced, and also the wire width of a lead-out wire 71 as a whole constituted with the lead-out electrode 55 and the terminal portion 53B can be reduced. As the result, the lead-out wires 70, 71 can be arranged with reduced intervals, and therefore the area occupied by the lead-out wires 70, 71, namely the area of the non-active area A2 can be reduced.

The lead-out electrodes 54, 55 are not in contact with the base material film 51, which exhibits only low adherence, and bonded only to the transparent electroconductive layers 52, 53, which exhibit high adherence. Therefore, even when a touch panel sensor is deformed during usage, generation of an origin initiating peeling of the lead-out electrodes 54, 55 from a touch panel sensor can be suppressed. Further, since the terminal portions 52B, 53B of the transparent electroconductive layers 52, 53 are not covered laterally by the lead-out electrodes 54, 55, the terminal portions 52B, 53B are constrained only weakly by the lead-out electrodes 54, 55, and therefore during deformation of a touch panel sensor, the terminal portions 52B, 53B can deform following the deformation of the base material film 51. Therefore, the lead-out electrodes 54, 55 can effectively suppress detachment of terminal portions 52B, 53B from the base material film 51 together with the transparent electroconductive layers 52, 53. As the result, the reliability of the detection function of a touch panel sensor can be improved remarkably.

<Process for Producing Electroconductive Film>

Figure 16A:
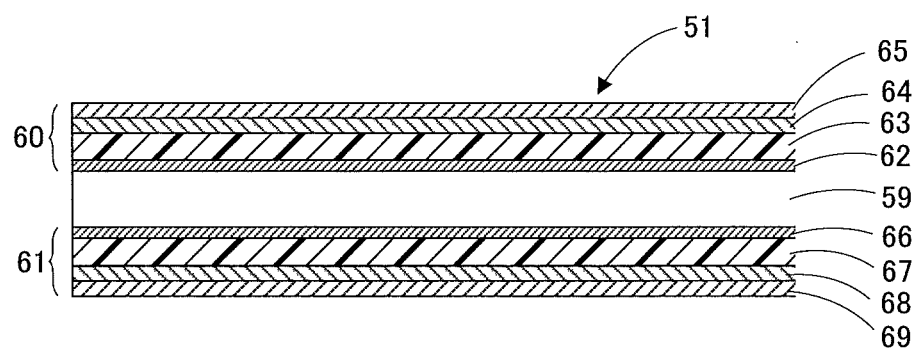
FIG. 16A is a schematic diagram showing a process step for producing an electroconductive film.

A process for producing an electroconductive film according to the present Embodiment will be described below in detail. Firstly, the base material film 51 including the light transmissive base material 59, and 2 or more functional layers 60, 61 laminated on both sides of the light transmissive base material 59, is prepared (FIG. 16A). In the present Embodiment, the easily adhesive layer 62, the hard coat layer 63, the high refractive index layer 64, and the low refractive index layer 65 are formed as the functional layers on a surface of the light transmissive base material 59 in the order mentioned, and the easily adhesive layer 66, the hard coat layer 67, the high refractive index layer 68, and the low refractive index layer 69 are formed as the functional layers on the other surface of the light transmissive base material 59 in the order mentioned.

Figure 16B:
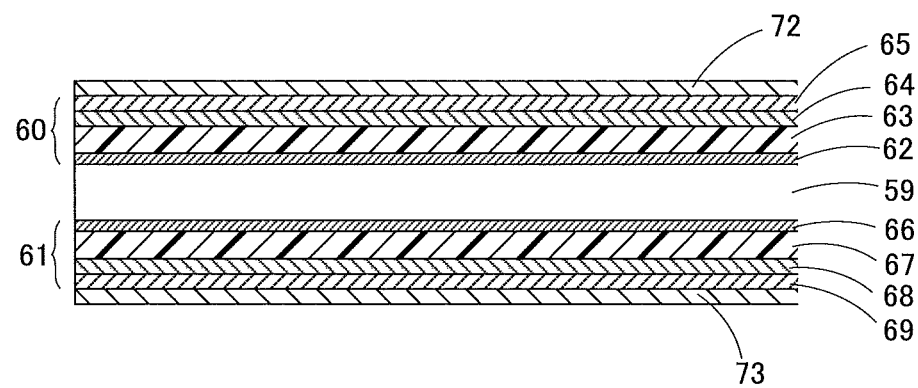
FIG. 16B is a schematic diagram showing a process step for producing an electroconductive film.

Next, by a sputtering process, etc. a transparent electroconductive layer 72 is formed on one surface (the surface of the low refractive index layer 65) of the base material film 51, and a transparent electroconductive layer 73 is formed on the other surface (the surface of the low refractive index layer 69) (FIG. 16B). Examples of a material for forming the transparent electroconductive layers 72, 73 include the same constitutional materials as used for the transparent electroconductive layers 52, 54.

Figure 16C:
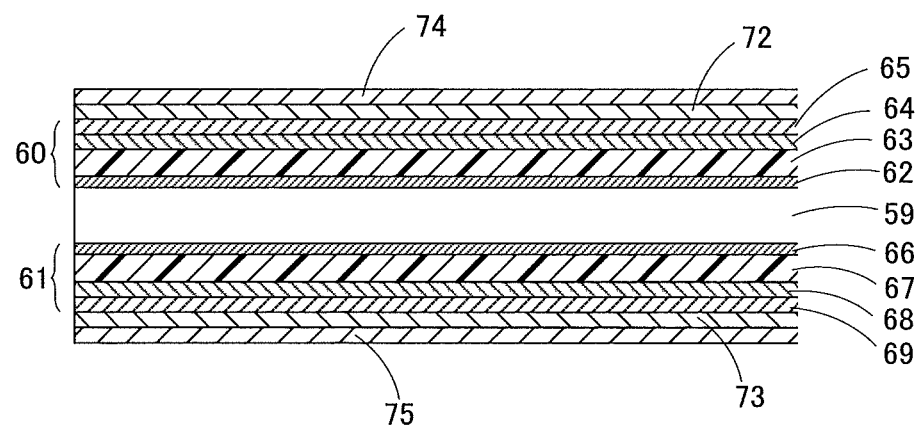
FIG. 16C is a schematic diagram showing a process step for producing an electroconductive film.

After forming the transparent electroconductive layers 72, 73 on both sides of the base material film 51, a light-shading electroconductive layer 74 having light-shading property and electrical conductivity is formed on the transparent electroconductive layer 72, and a light-shading electroconductive layer 75 having light-shading property and electrical conductivity is formed on the transparent electroconductive layer 73 by a sputtering process, etc. (FIG. 16C). Examples of a material for forming the light-shading electroconductive layers 74, 75, include the same constitutional materials as used for the lead-out electrode 54, 56.

Figure 17A:
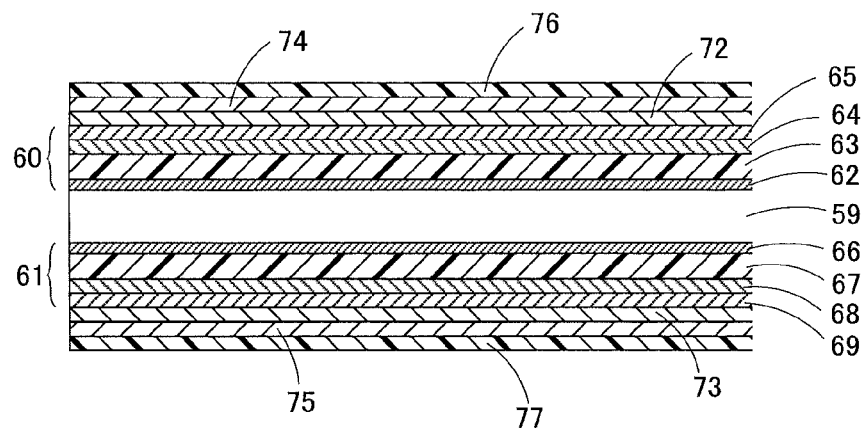
FIG. 17A is a schematic diagram showing a process step for producing an electroconductive film.

After forming the light-shading electroconductive layers 74, 75 on the transparent electroconductive layers 72, 73, a photosensitive layer 76 is formed on the light-shading electroconductive layer 74, and a photosensitive layer 77 is formed on the light-shading electroconductive layer 75 (FIG. 17A). The photosensitive layers 76, 77 are photosensitive to light with a specific wavelength range, for example, ultraviolet light. The photosensitive layers 76, 77 can be formed by coating a photosensitive material by a coater on the light-shading electroconductive layers 74, 75.

Figure 17B:
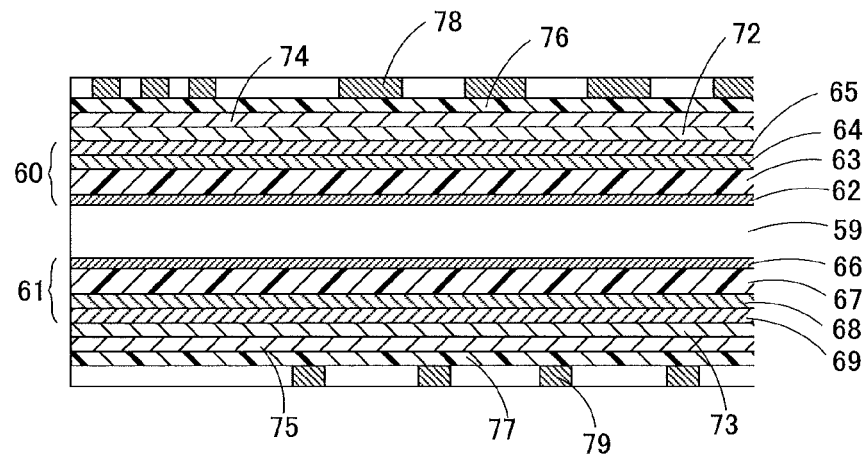
FIG. 17B is a schematic diagram showing a process step for producing an electroconductive film.

Next a mask 78 is placed on the photosensitive layer 76, and a mask 79 is placed on the photosensitive layer 77 (FIG. 17B). The mask 78 is in a pattern corresponding to a pattern, in which the transparent electroconductive layer 52 is to be formed, and the mask 79 is in a pattern corresponding to a pattern, in which the transparent electroconductive layer 53 is to be formed. The pattern of the mask 78 and the pattern of the mask 79 are different from each other.

The mask 78 and the mask 79 may be positioned referring to an alignment mark established on each of masks 78, 79 (not illustrated). By this method, the masks 78, 79 can be positioned with respect to each other very accurately (for example, in the order of magnitude of micrometer) and very easily (therefore, in a short time).

Figure 17C:
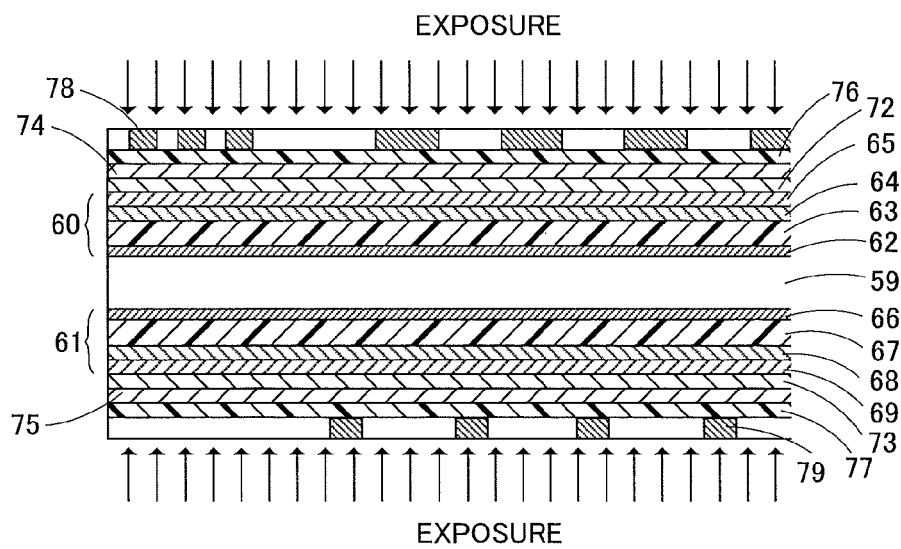
FIG. 17C is a schematic diagram showing a process step for producing an electroconductive film.

In a state where the masks 78, 79 are placed on the photosensitive layers 76, 77, the photosensitive layer 76 is exposed to irradiation with light corresponding to the photosensitivity of the photosensitive layer 76 (for example, ultraviolet light) through the mask 78. Further, the photosensitive layer 77 is exposed to irradiation with light corresponding to the photosensitivity of the photosensitive layer 77 (for example, ultraviolet light) through the mask 79 (FIG. 17C). The photosensitive layers 76, 77 shown in FIG. 17C are a positive-type photosensitive layer. Therefore, such a part of the photosensitive layers 76, 77, as is removed by etching for forming the transparent electroconductive layers 52, 54, is irradiated with light. Since the light-shading electroconductive layers 74, 75 are present under the photosensitive layers 76, 77, the light from an exposing source passes the photosensitive layers 76, 77 but do not pass the light-shading electroconductive layers 74, 75 without reaching the transparent electroconductive layers 72, 73. As the result, in the exposure step a photosensitive layer can be exposed accurately in an intended pattern.

Figure 18A:
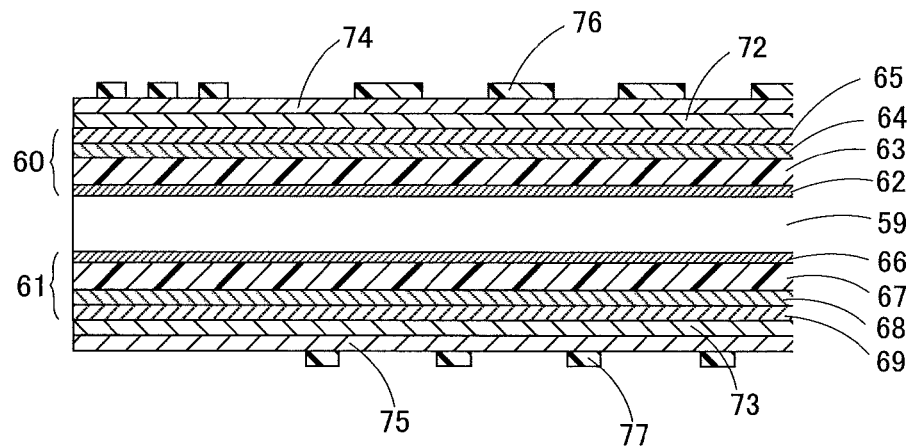
FIG. 18A is a schematic diagram showing a process step for producing an electroconductive film.

After exposure of the photosensitive layers 76, 77, the photosensitive layers 76, 77 are developed (FIG. 18A). Specifically, a developing solution corresponding to the photosensitive layers 76, 77 is prepared, and the photosensitive layers 76, 77 is developed by using the developing solution. By this, a part of the photosensitive layers 76, 77, which has been irradiated with light emitted from an exposing source without being shaded by the masks 78, 79, is removed to leave the photosensitive layers 76, 77 in a predetermined pattern.

Figure 18B:
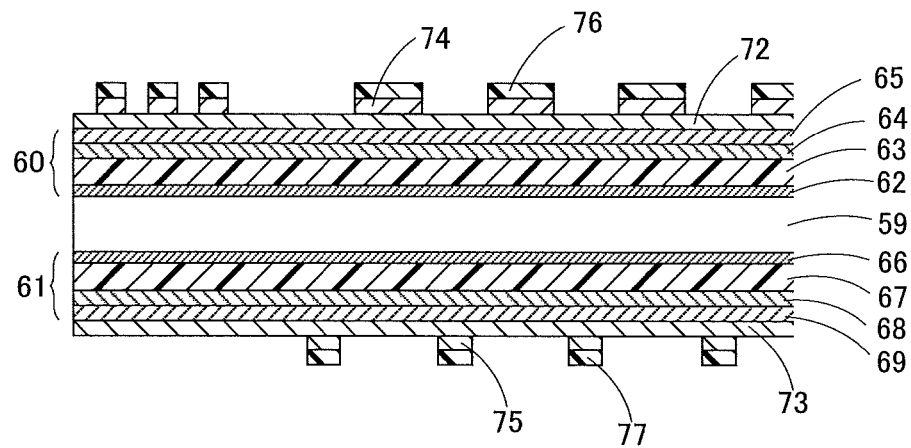
FIG. 18B is a schematic diagram showing a process step for producing an electroconductive film.

Then, the light-shading electroconductive layer 74 is etched using the patterned photosensitive layer 76 as a mask, and an light-shading electroconductive layer 75 is etched using the patterned photosensitive layer as a mask (FIG. 18B). By this etching, the light-shading electroconductive layer 74 is patterned in substantially the same pattern as the photosensitive layer 76, and the light-shading electroconductive layer 75 is patterned in substantially the same pattern as the photosensitive layer 77. As an etching solution, an etching solution similar to that used for etching the light-shading electroconductive layer 32 may be used.

Figure 18C:
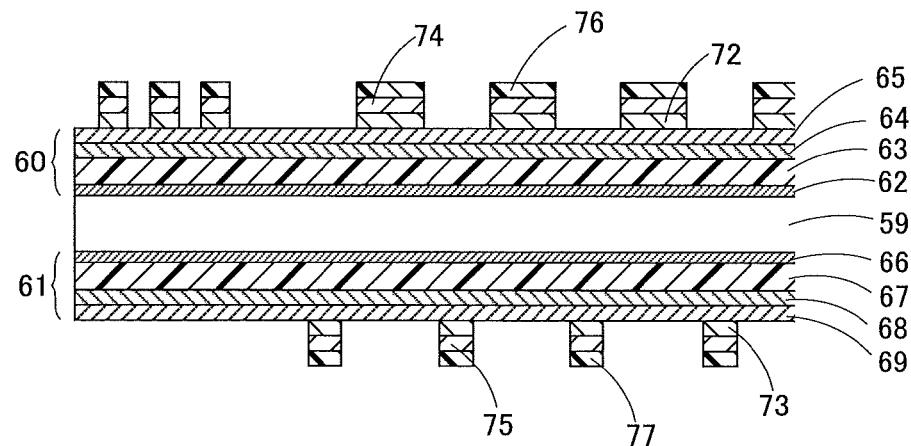
FIG. 18C is a schematic diagram showing a process step for producing an electroconductive film.

After etching the light-shading electroconductive layers 74, 75, using the patterned photosensitive layer 76 and the light-shading electroconductive layer 74 as a mask, the transparent electroconductive layer 72 is etched, and using the patterned photosensitive layer 77 and the light-shading electroconductive layer 75 as a mask, the transparent electroconductive layer 73 is etched (FIG. 18C). By this etching, the transparent electroconductive layer 72 is patterned in substantially the same pattern as the photosensitive layer 76 and the light-shading electroconductive layer 74, and the transparent electroconductive layer 73 is patterned in substantially the same pattern as the photosensitive layer 77 and the light-shading electroconductive layer 75. If the transparent electroconductive layers 72, 73 are made of ITO, ferric chloride may be used for an etching solution.

Figure 19A:
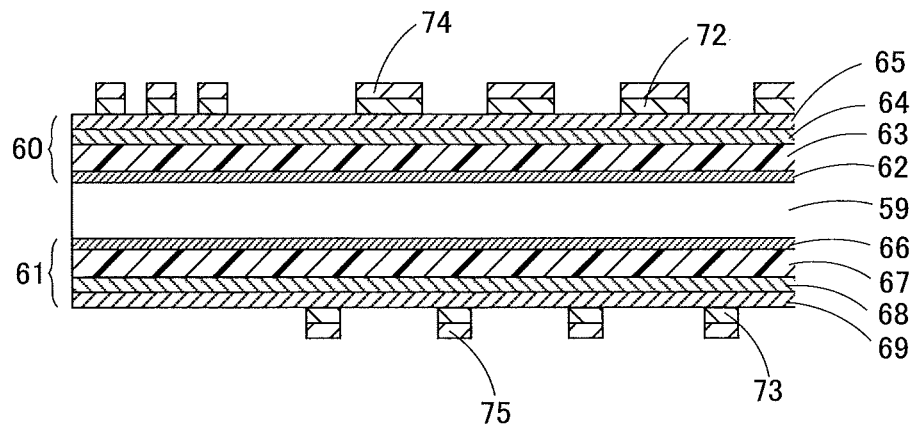
FIG. 19A is a schematic diagram showing a process step for producing an electroconductive film.

After etching the transparent electroconductives layer 72, 73, the residual photosensitive layers 76, 77 on the light-shading electroconductive layer 74, 75 are removed (FIG. 19A). By the removal of the photosensitive layers 76, 77, the patterned light-shading electroconductive layers 74, 75 are exposed. The photosensitive layers 76, 77 can be removed, for example, with an alkaline liquid such as a 2% potassium hydroxide solution.

Figure 19B:
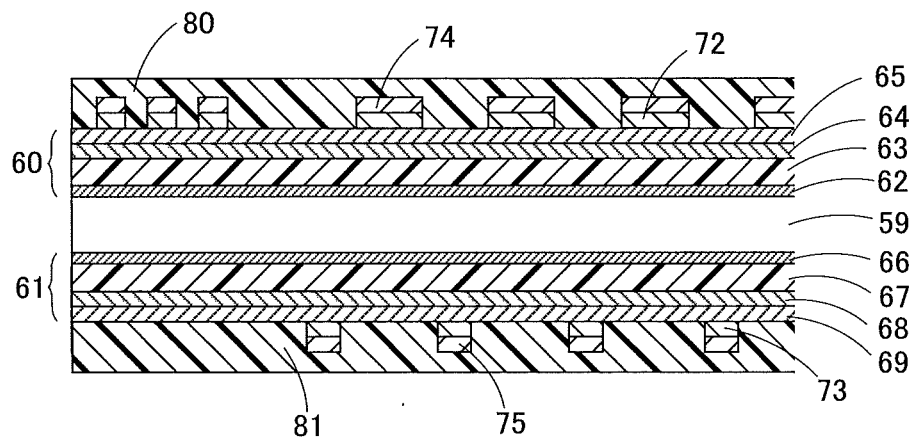
FIG. 19B is a schematic diagram showing a process step for producing an electroconductive film.

Next, a photosensitive layer 80 is formed on the light-shading electroconductive layer 74 covering the light-shading electroconductive layer 74, and a photosensitive layer 81 is formed on the light-shading electroconductive layer 75 covering the light-shading electroconductive layer 75 (FIG. 19B). The photosensitive layers 80, 81 are sensitive to light in a specific wavelength range, for example ultraviolet light, identically with the photosensitive layers 76, 77. Further, the photosensitive layers 80, 81 can be formed identically with the photosensitive layers 76, 77 by coating a photosensitive material with a coater.

Figure 19C:
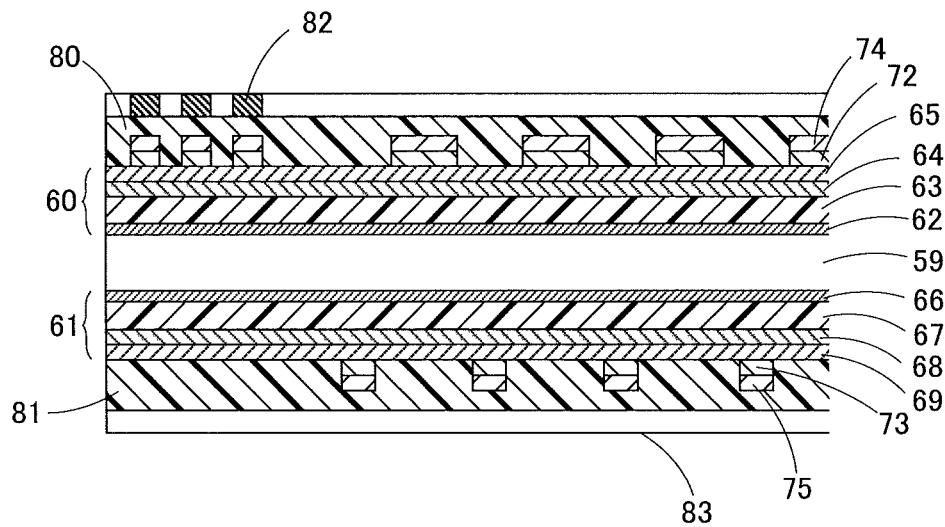
FIG. 19C is a schematic diagram showing a process step for producing an electroconductive film.

Next, a mask 82 is placed on the photosensitive layer 80, and a mask 83 is placed on the photosensitive layer 81 (FIG. 19C). The mask 82 has a pattern corresponding to a part to be removed for forming the lead-out electrode 54, and the mask 83 has a pattern corresponding to a part to be removed for forming the lead-out electrode 55. The masks 82, 83 have a pattern formed corresponding to the active area A1, more precisely a translucent region formed slightly larger than the active area A1.

Figure 20A:
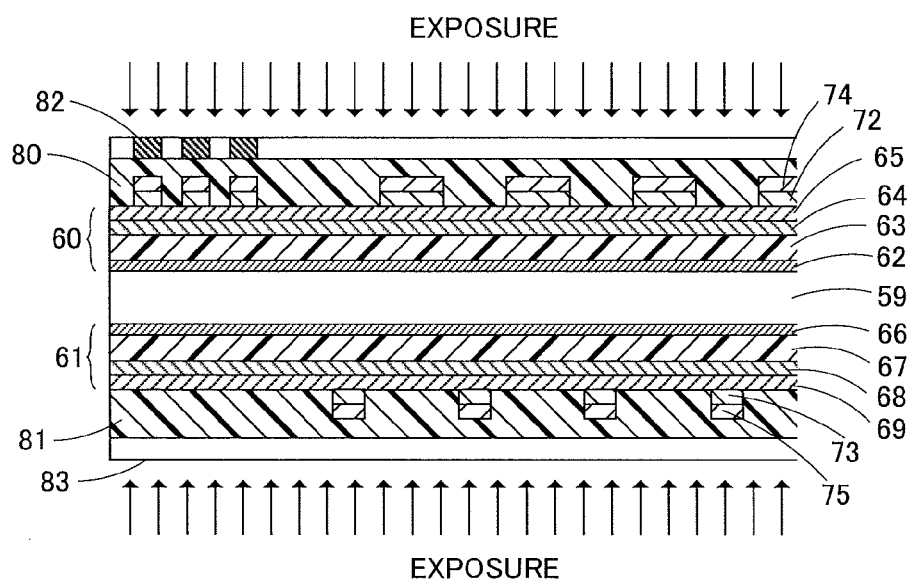
FIG. 20A is a schematic diagram showing a process step for producing an electroconductive film.

In a state, where the masks 82, 83 are placed on the photosensitive layers 80, 81, the photosensitive layer 80 is exposed to irradiation with light corresponding to the photosensitivity of the photosensitive layer 80 (for example, ultraviolet light) through the mask 82, and the photosensitive layer is exposed to irradiation with light corresponding to the photosensitivity of the photosensitive layer 81 (for example, ultraviolet light) through the mask 83 (FIG. 20A). The photosensitive layers 80, 81 shown in FIG. 18A are a positive type photosensitive layer. The masks 82, 83 have a translucent region including the active area A1. Consequently, the active area A1 and the surroundings of the photosensitive layers 80, 81 are irradiated with light.

Figure 20B:
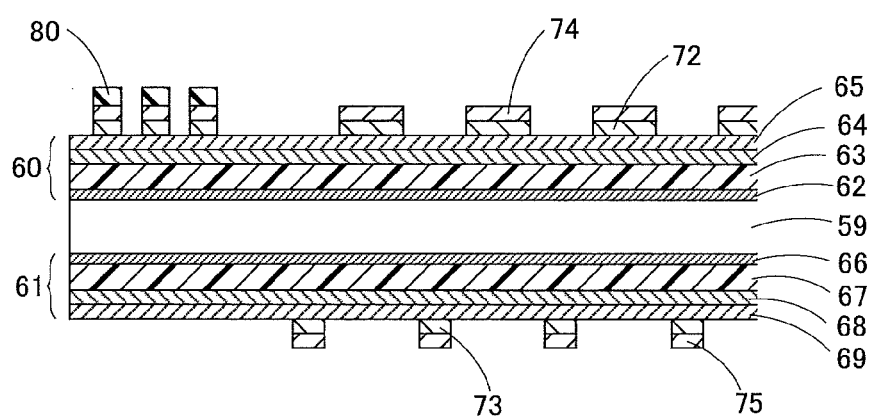
FIG. 20B is a schematic diagram showing a process step for producing an electroconductive film.

After exposing the photosensitive layers 80, 81, the photosensitive layers 80, 81 are developed (FIG. 20B). Specifically, a developing solution corresponding to a photosensitive layer 80, 81 is prepared, and a photosensitive layer 80, 81 is developed using the developing solution. By this, the active area A1 and the surrounding regions in the photosensitive layer 80 are removed, so that the photosensitive layer 80 remains only in the non-active area A2, and the active area A1 and the surrounding regions in the photosensitive layer 81 are removed, so that the photosensitive layer 81 remains only in a non-active area A2.

Figure 20C:
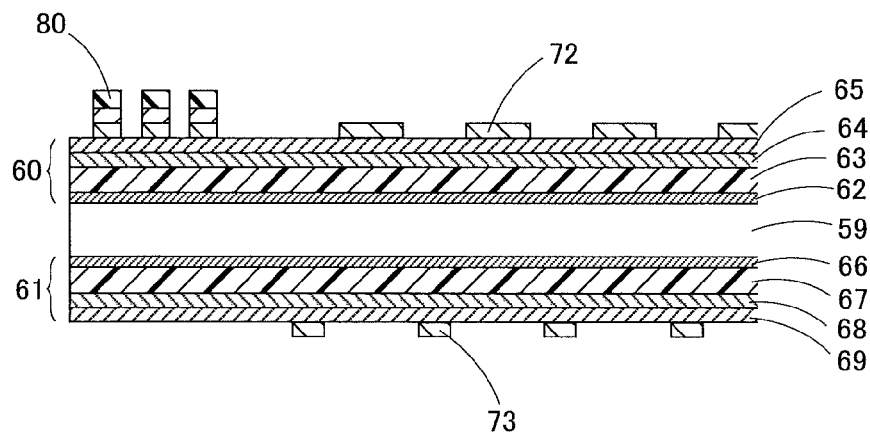
FIG. 20C is a schematic diagram showing a process step for producing an electroconductive film.

Then, the light-shading electroconductive layer 74 is etched using the patterned photosensitive layer 80 as a mask, and the light-shading electroconductive layer 75 is etched using the patterned photosensitive layer 81 as a mask (FIG. 20). For the etching, an etching solution similar to an etching solution used for etching the light-shading electroconductive layer 32 using the photosensitive layer 35 as a mask.

By this etching, at least a part of the patterned light-shading electroconductive layers 74, 75 situated in the active area A1 is removed. From this, only the base material film 51 and the transparent electroconductive layer 72 remain in the active area A1, or only the base material film 51 and the transparent electroconductive layer 73 remain in the active area A1, and therefore the active area A1 comes to have translucency over the entire region.

As described above, parts of the light-shading electroconductive layer 74 not covered by the photosensitive layer 80 are removed and the transparent electroconductive layer 72 is exposed, and parts of the light-shading electroconductive layer 75 not covered by the photosensitive layer 81 are removed and the transparent electroconductive layer 73 is exposed. The exposed transparent electroconductive layers 72, 73 are situated in the active area A1 and the surroundings thereof. The transparent electroconductive layer 72 situated in the active area A1 forms the sensor portion 53A, and the transparent electroconductive layer 72 situated in the non-active area A2 forms the terminal portion 53B. Further, the transparent electroconductive layer 73 situated in the active area A1 forms the sensor portion 54A, and the transparent electroconductive layer 73 situated in the non-active area A2 forms the terminal portion 54B.

Figure 21:
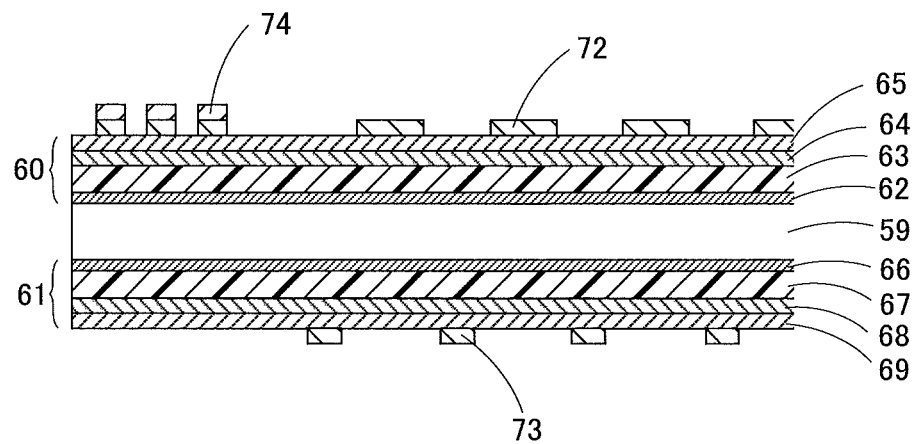
FIG. 21 is a schematic diagram showing a process step for producing an electroconductive film.
Figure 22:
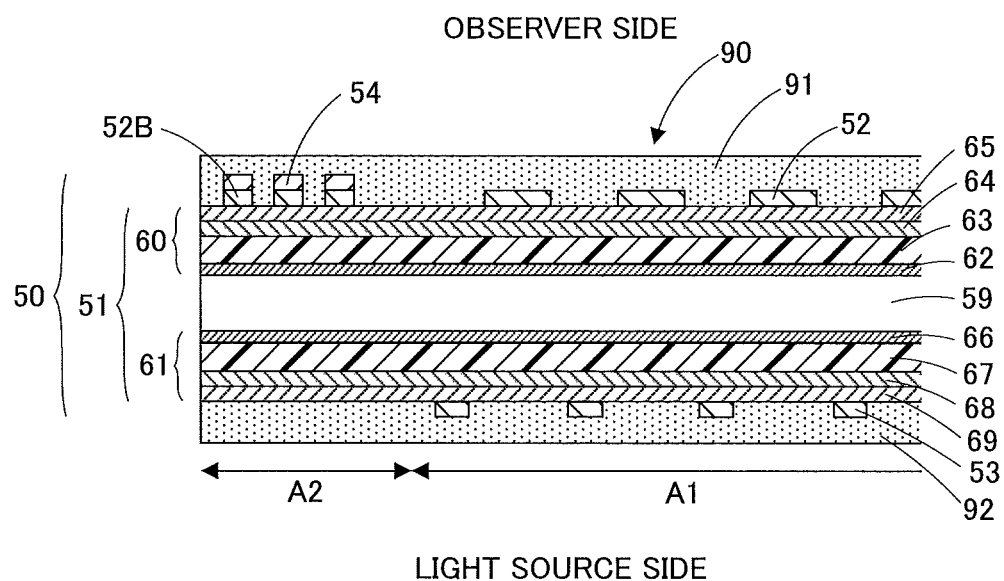
FIG. 22 is a cross-sectional view of a touch panel sensor according to the second Embodiment.

After etching the light-shading electroconductive layers 74, 75, the photosensitive layer 80 remaining over the light-shading electroconductive layer 74 is removed, and the photosensitive layer 81 remaining over the light-shading electroconductive layer 75 is removed (FIG. 21). After removal of the photosensitive layers 80, 81, the patterned light-shading electroconductive layers 74, 75 are exposed. Although the light-shading electroconductive layer 75 is not exhibited in FIG. 21, it is merely because the same does not appear in the cross-section, and the light-shading electroconductive layer 75 appears in another cross-section.

The exposed light-shading electroconductive layer 74 becomes the lead-out electrode 54, and the exposed light-shading electroconductive layer 75 becomes the lead-out electrode 55. Further, between the formed lead-out electrode 54 and the base material film 51, the terminal portion 52B made of the transparent electroconductive layer 72 is formed, and between the formed lead-out electrode 55 and the base material film 51, the terminal portion 53B made of the transparent electroconductive layer 73 is formed. Thus, the electroconductive film 50 is obtained.

In the production process, the lead-out electrodes 54, 55 and the terminal portions 52B, 53B of the transparent electroconductive layers 52, 53 are formed by a photolithography technology, and therefore they can be formed very accurately at a desired position and in a desired shape compared to a conventional process by a screen printing process. Consequently, the lead-out electrode 54 can be formed on only a part of the terminal portion 52B of the transparent electroconductive layer 52, and the lead-out electrode 55 can be formed on only a part of the terminal portion 53B of the transparent electroconductive layer 53.

<Touch Panel Sensor>

The electroconductive film 50 can be used, for example, incorporated into a touch panel sensor. A touch panel sensor 90 shown in FIG. 22 has a structure using a sheet of the electroconductive film 50.

On both surfaces of the electroconductive film 50, transparent adhesive layers 91, 92 for bonding to a protection cover such as a cover glass, or another material are laminated. Examples of the transparent adhesive layers 91, 92 include a publicly known pressure sensitive adhesive layer and adhesive sheet.

[Third Embodiment]

Figure 23:
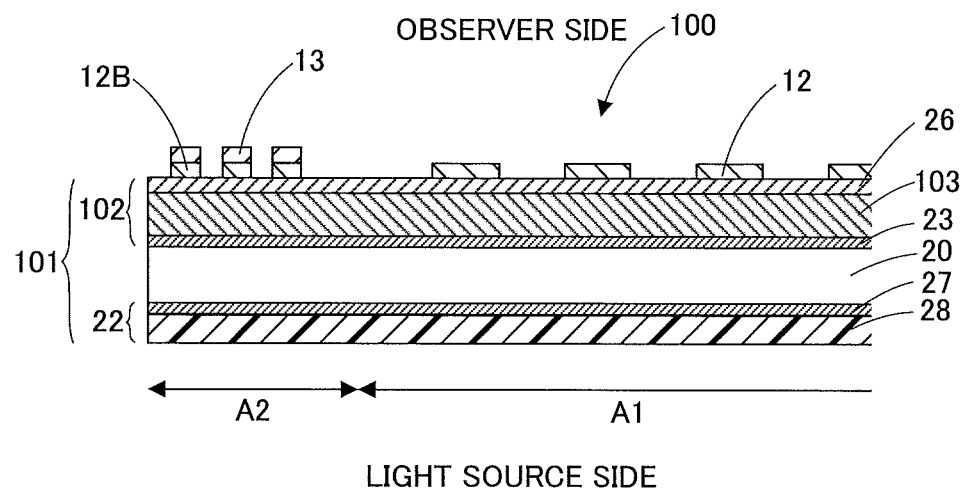
FIG. 23 is a schematic structural view of an electroconductive film according to the third Embodiment.

An electroconductive film and a touch panel sensor of the 3rd Embodiment according to the present invention will be described below referring to drawings. FIG. 23 is a schematic structural view of an electroconductive film according to the present Embodiment and FIG. 24 is a schematic structural view of another electroconductive film according to the present Embodiment.

<Electroconductive Film>

An electroconductive film 100 shown in FIG. 23 includes a base material film 101, a transparent electroconductive layer 12, which is provided on one surface of the base material film 101 and patterned, and a lead-out electrode 13, which is provided only on a part of the transparent electroconductive layer 12 and has opacity and electrical conductivity.

Figure 24:
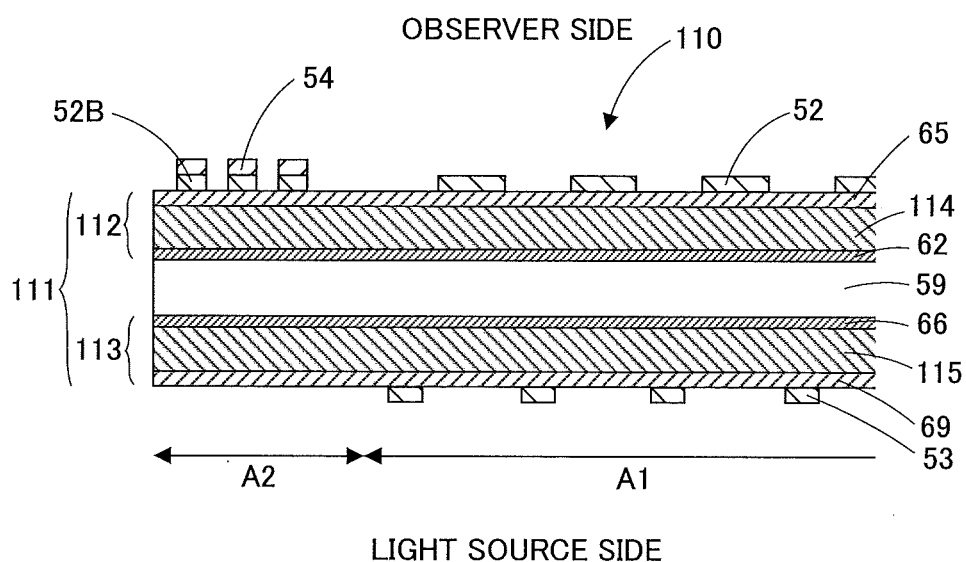
FIG. 24 is a schematic structural view of another electroconductive film according to the third Embodiment.

An electroconductive film 110 shown in FIG. 24 includes a base material film 111, a transparent electroconductive layer 52, which is provided on one surface of the base material film 111 and patterned, a transparent electroconductive layer 53, which is provided on the other surface of the base material film 111 and patterned, a lead-out electrode 54, which is provided only on a part of the transparent electroconductive layer 52 and has opacity and electrical conductivity, and a lead-out electrode 55, which is provided only on the part of the transparent electroconductive layer 53 and has opacity and electrical conductivity.

<Base Material Film>

The base material film 101 shown in FIG. 23 includes a light transmissive base material 20 and functional layers 102, 22 laminated on both sides of the light transmissive base material 20. A base material film 111 shown in FIG. 24 includes a light transmissive base material 59 and functional layers 112, 113 laminated on both sides of the light transmissive base material 59.

When the base material film 101 is irradiated with visible light from a surface side of the functional layer 102 while an incidence angle is varied every five degrees in a range of 5° or more and 75° or less, assuming that a normal direction of a surface of the base material film 101 is 0°, to determine a* and b* values in a L*a*b* color system from reflected light toward each regular reflection direction, a variation of the a* values is 1.0 or less, and a variation of the b* values is 3.0 or less with respect to the base material film 101. The variation of the a* values is preferably within 0.4, and the variation of the b* values is preferably within 1.6 and more preferably within 1.55.

When the base material film 111 is irradiated with visible light from a surface side of the functional layer 112 while an incidence angle is varied every five degrees in a range of 5° or more and 75° or less, assuming that a normal direction of a surface of the base material film 111 is 0°, to determine a* and b* values in a L*a*b* color system from reflected light toward each regular reflection direction, a variation of the a* values is 1.0 or less, and a variation of the b* values is 3.0 or less with respect to the base material film 111. The variation of the a* values is preferably within 0.4, and the variation of the b* values is preferably within 1.6 and more preferably within 1.55.

A measuring method for the a* value and the b* value and a calculation method of the variation range thereof are similar to the measuring method for the a* value and the b* value and the calculation method of the variation range thereof with respect to the base material film 11 described in the first Embodiment.

The color difference ΔE*ab between the reflected light at an angle, at which the a* value and b* value are measured and the reflected light at another angle, at which the a* value and b* value are measured, is preferably 5 or less.

According to the present Embodiment, when the base material film 101 is irradiated with light from a surface side of the functional layer 102 while an incidence angle is varied every five degrees in a range of 5° or more and 75° or less, assuming that a normal direction of a surface of the base material film 111 is 0°, to determine a* and b* values in a L*a*b* color system from reflected light toward each regular reflection direction, a variation of the a* values is 1.0 or less, and a variation of the b* values is 3.0 or less, and therefore the variation of hue when the base material film 101 is viewed from various directions can be suppressed.

According to the present Embodiment, when the base material film 111 is irradiated with light from a surface side of the functional layer 112 while an incidence angle is varied every five degrees in a range of 5° or more and 75° or less, assuming that a normal direction of a surface of the base material film 111 is 0°, to determine a* and b* values in a L*a*b* color system from reflected light toward each regular reflection direction, a variation of the a* values is 1.0 or less, and a variation of the b* values is 3.0 or less, and therefore the variation of hue when the base material film 111 is viewed from various directions can be suppressed.

<Functional Layer>

The structure of the functional layer 102 shown in FIG. 23 is different from the functional layer 21. Specifically, in the case of the base material film 101 shown in FIG. 23, the easily adhesive layer 23, the high refractive index layer 103, and the low refractive index layer 26 are laminated on a surface of the light transmissive base material 20 in the order mentioned, and the easily adhesive layer 27, and the hard coat layer 28 are laminated on the other surface of the light transmissive base material 20 in the order mentioned. In other words, the functional layer 102 does not include a hard coat layer.

The structures of the functional layers 112, 113 shown in FIG. 24 are different from the functional layers 60, 61. Specifically, in the case of the base material film 111 shown in FIG. 24, an easily adhesive layer 62, a high refractive index layer 114, and a low refractive index layer 65 are laminated on a surface of the light transmissive base material 59 in the order mentioned, and an easily adhesive layer 66, a high refractive index layer 115, and a low refractive index layer 69 are laminated on the other surface of the light transmissive base material 59 in the order mentioned. In other words, the functional layers 112, 113 do not include a hard coat layer.

(High Refractive Index Layer)

The high refractive index layers 103, 114, 115 are identical with the high refractive index layer 25 described in the first Embodiment except the film thickness. The film thicknesses of the high refractive index layers 103, 114, 115 are 0.5 μm or more and 10 μm or less. When the film thicknesses of the high refractive index layers 103, 114, 115 are 0.5 μm or more, the hardness similar to the base material films 101, 111 can be obtained without intercalating a hard coat layer between the light transmissive base material 20 and the high refractive index layer 103 or between the light transmissive base material 59 and the high refractive index layer 114, 115. Further, when the film thicknesses of the high refractive index layers 103, 114, 115 are 10 μm or less, cracking of a high refractive index layer, which may occur during roll-to-roll production of a base material film, can be suppressed.

The lower limit of the film thicknesses of the high refractive index layers 103, 114, 115 is more preferably 1.0 μm or more, and the upper limit of the film thicknesses of the high refractive index layers 103, 114, 115 is more preferably 5.0 μm or less.

<Touch Panel Sensor>

The electroconductive films 100, 110 can be mounted in a touch panel sensor with a structure similar to those of the touch panel sensors shown in FIG. 12 and FIG. 22.

EXAMPLES

The present invention will be described below in detail referring to Examples, provide that the present invention be not limited thereto.

<Preparation of Composition for Hard Coat Layer>

Relevant components are mixed to the following composition to obtain a composition for a hard coat layer.

(Composition for Hard Coat Layer 1).

Pentaerythritol triacrylate (PETA): 30 parts by mass

Polymerization initiator (product name "IRGACURE 184", made by BASF Japan Ltd.): 1.5 parts by mass Silicone leveling agent (product name "SEIKABEAM 10-28", made by Dainichiseika Colour & Chemicals Mfg. Co., Ltd., solid content 10%): 0.05 part by mass Methyl isobutyl ketone: 70 parts by mass (Composition for Hard Coat Layer 2)

Pentaerythritol triacrylate (PETA): 18 parts by mass

Propylene glycol monomethyl ether acetate (PGMEA): 12 parts by mass

Polymerization initiator (product name "IRGACURE 184", made by BASF Japan Ltd.): 1.5 parts by mass Methyl isobutyl ketone: 70 parts by mass <Preparation of Composition for High Refractive Index Layer>

Relevant components are mixed to the following composition to obtain a composition for a high refractive index layer (Composition for High Refractive Index Layer 1)

High refractive index fine particle dispersion liquid (Dispersion of $ZrO_2$ fine particle in methyl ethyl ketone (solid content 32.5 mass %), product name "MZ-230X", made by Sumitomo Osaka Cement Co., Ltd.): 58.8 parts by mass Pentaerythritol triacrylate (product name "KAYARAD PET-30", made by Nippon Kayaku Co., Ltd.): 11.8 parts by mass Polymerization initiator (product name "IRGACURE 184", made by BASF Japan Ltd.): 0.6 part by mass Silicone leveling agent (product name "SEIKABEAM 10-28", made by Dainichiseika Colour & Chemicals Mfg. Co., Ltd., solid content 10%): 0.03 part by mass Methyl isobutyl ketone (MIBK): 28.8 parts by mass (Composition for High Refractive Index Layer 2)

High refractive index fine particle dispersion liquid (Dispersion of $ZrO_2$ fine particle in methyl ethyl ketone (solid content 32.5 mass %), product name "MZ-230X", made by Sumitomo Osaka Cement Co., Ltd.): 59.5 parts by mass Pentaerythritol triacrylate (product name "KAYARAD PET-30", made by Nippon Kayaku Co., Ltd.): 11.1 parts by mass Polymerization initiator (product name "IRGACURE 184", made by BASF Japan Ltd.): 0.6 part by mass Silicone leveling agent (product name "SEIKABEAM 10-28", made by Dainichiseika Colour & Chemicals Mfg. Co., Ltd., solid content 10%): 0.03 part by mass Methyl isobutyl ketone (MIBK): 28.8 parts by mass (Composition for High Refractive Index Layer 3)

High refractive index fine particle dispersion liquid (Dispersion of $ZrO_2$ fine particle in methyl ethyl ketone (solid content 32.5 mass %), product name "MZ-230X", made by Sumitomo Osaka Cement Co., Ltd.): 59.9 parts by mass Pentaerythritol triacrylate (product name "KAYARAD PET-30", made by Nippon Kayaku Co., Ltd.): 10.7 parts by mass Polymerization initiator (product name "IRGACURE 184", made by BASF Japan Ltd.): 0.6 part by mass Silicone leveling agent (product name "SEIKABEAM 10-28", made by Dainichiseika Colour & Chemicals Mfg. Co., Ltd., solid content 10%): 0.03 part by mass Methyl isobutyl ketone (MIBK): 28.8 parts by mass (Composition for High Refractive Index Layer 4)

High refractive index fine particle dispersion liquid (Dispersion of $ZrO_2$ fine particle in methyl ethyl ketone (solid content 32.5 mass %), product name "MZ-230X", made by Sumitomo Osaka Cement Co., Ltd.): 62.0 parts by mass Pentaerythritol triacrylate (product name "KAYARAD PET-30", made by Nippon Kayaku Co., Ltd.): 8.6 parts by mass Polymerization initiator (product name "IRGACURE 184", made by BASF Japan Ltd.): 0.6 part by mass Silicone leveling agent (product name "SEIKABEAM 10-28", made by Dainichiseika Colour & Chemicals Mfg. Co., Ltd., solid content 10%): 0.03 part by mass Methyl isobutyl ketone (MIBK): 28.8 parts by mass (Composition for High Refractive Index Layer 5)

High refractive index fine particle dispersion liquid (Dispersion of $ZrO_2$ fine particle in methyl ethyl ketone (solid content 32.5 mass %), product name "MZ-230X", made by Sumitomo Osaka Cement Co., Ltd.): 15.8 parts by mass Pentaerythritol triacrylate (product name "KAYARAD PET-30", made by Nippon Kayaku Co., Ltd.): 62.0 parts by mass Polymerization initiator (product name "IRGACURE 184", made by BASF Japan Ltd.): 0.6 part by mass Silicone leveling agent (product name "SEIKABEAM 10-28", made by Dainichiseika Colour & Chemicals Mfg. Co., Ltd., solid content 10%): 0.03 part by mass Methyl isobutyl ketone (MIBK): 200 parts by mass <Preparation of Composition for Low Refractive Index Layer>

Relevant components are mixed to the following composition to obtain a composition for a low refractive index layer (Composition for Low Refractive Index Layer 1)

Hollow silica fine particle (Dispersion of hollow silica fine particle in methyl isobutyl ketone (solid content: 20 mass %)): 40 parts by mass Pentaerythritol triacrylate (PETA) (product name "PETIA", made by Daicel-Cytec Co. Ltd.): 10 parts by mass Polymerization initiator (product name "IRGACURE 127", made by BASF Japan Ltd.): 0.35 part by mass Modified silicone oil (product name "X22164E", made by Shin-Etsu Chemical Co., Ltd.): 0.5 part by mass Methyl isobutyl ketone (MIBK): 320 parts by mass Propylene glycol monomethyl ether acetate (PGMEA): 161 parts by mass (Composition for Low Refractive Index Layer 2)

Hollow silica fine particle (Dispersion of hollow silica fine particle in methyl isobutyl ketone (solid content: 20 mass %)): 40.5 parts by mass Pentaerythritol triacrylate (PETA) (product name "PETIA", made by Daicel-Cytec Co. Ltd.): 9.5 parts by mass Polymerization initiator (product name "IRGACURE 127", made by BASF Japan Ltd.): 0.35 part by mass Modified silicone oil (product name "X22164E", made by Shin-Etsu Chemical Co., Ltd.): 0.5 part by mass Methyl isobutyl ketone (MIBK): 320 parts by mass Propylene glycol monomethyl ether acetate (PGMEA): 161 parts by mass (Composition for Low Refractive Index Layer 3)

Hollow silica fine particle (Dispersion of hollow silica fine particle in methyl isobutyl ketone (solid content: 20 mass %)): 41 parts by mass Pentaerythritol triacrylate (PETA) (product name "PETIA", made by Daicel-Cytec Co. Ltd.): 9 parts by mass Polymerization initiator (product name "IRGACURE 127", made by BASF Japan Ltd.): 0.35 part by mass Modified silicone oil (product name "X22164E", made by Shin-Etsu Chemical Co., Ltd.): 0.5 part by mass Methyl isobutyl ketone (MIBK): 320 parts by mass Propylene glycol monomethyl ether acetate (PGMEA): 161 parts by mass (Composition for Low Refractive Index Layer 4)

Hollow silica fine particle (Dispersion of hollow silica fine particle in methyl isobutyl ketone (solid content: 20 mass %)): 38.4 parts by mass Pentaerythritol triacrylate (PETA) (product name "PETIA", made by Daicel-Cytec Co. Ltd.): 8.4 parts by mass Polymerization initiator (product name "IRGACURE 127", made by BASF Japan Ltd.): 0.35 part by mass Modified silicone oil (product name "X22164E", made by Shin-Etsu Chemical Co., Ltd.): 0.5 part by mass Methyl isobutyl ketone (MIBK): 320 parts by mass Propylene glycol monomethyl ether acetate (PGMEA): 161 parts by mass (Composition for Low Refractive Index Layer 5)

Hollow silica fine particle (Dispersion of hollow silica fine particle in methyl isobutyl ketone (solid content: 20 mass %)): 35.7 parts by mass Pentaerythritol triacrylate (PETA) (product name "PETIA", made by Daicel-Cytec Co. Ltd.): 5.7 parts by mass Polymerization initiator (product name "IRGACURE 127", made by BASF Japan Ltd.): 0.35 part by mass Modified silicone oil (product name "X22164E", made by Shin-Etsu Chemical Co., Ltd.): 0.5 part by mass Methyl isobutyl ketone (MIBK): 320 parts by mass Propylene glycol monomethyl ether acetate (PGMEA): 161 parts by mass Example 1

As a light transmissive base material, a 125 μm-thick polyethylene terephthalate substrate with an easily adhesive layer (product name "COSMOSHINE", made by Toyobo Co., Ltd.) was prepared, and the composition for hard coat layer 1 was coated on both surfaces of the polyethylene terephthalate substrate to form coatings. Next, dry air at 50° C. was blown at a flow rate of 0.2 m/sec for 15 sec and then dry air at 70° C. was blown at a flow rate of 10 m/sec for 30 sec on the coatings for drying and evaporating a solvent in the coatings, which were then irradiated with ultraviolet light in a nitrogen atmosphere (oxygen concentration of 200 ppm or less) up to a cumulative amount of light of 100 mJ/cm$^2$ for curing, to form 4.5 μm-thick hard coat layers with a refractive index of 1.52. Next, the composition for high refractive index layer 1 was coated on each hard coat layer to form coatings. Then the formed coatings were dried at 40° C. for 1 min, and cured by irradiation with ultraviolet light up to a cumulative amount of light of 100 mJ/cm$^2$ in a nitrogen atmosphere (oxygen concentration of 200 ppm or less) to form 50 nm-thick high refractive index layers with a refractive index of 1.67. Next, the composition for low refractive index layer 1 was coated on each high refractive index layer to form coatings. Then the formed coatings were dried at 40° C. for 1 min, and cured by irradiation with ultraviolet light up to a cumulative amount of light of 100 mJ/cm$^2$ in a nitrogen atmosphere (oxygen concentration of 200 ppm or less) to form 20 nm-thick low refractive index layers with a refractive index of 1.49 thereby obtaining a base material film of Example 1.

Example 2

In Example 2, a base material film was prepared identically with Example 1, except that the composition for high refractive index layer 2, and the composition for low refractive index layer 2 were used instead of the composition for high refractive index layer 1, and the composition for low refractive index layer 1. The refractive index of a high refractive index layer of the base material film of Example 2 was 1.69, and the same of a low refractive index layer was 1.51.

Example 3

In Example 3, a base material film was prepared identically with Example 1, except that the composition for hard coat layer 2, the composition for high refractive index layer 3, and the composition for low refractive index layer 3 were used instead of the composition for hard coat layer 1, the composition for high refractive index layer 1, and the composition for low refractive index layer 1, and a high refractive index layer having a film thickness of 60 nm was formed. The refractive index of a hard coat layer of a base material film according to Example 3 was 1.53, the same of a high refractive index layer was 1.70, and the same of a low refractive index layer was 1.53.

Example 4

In Example 4, a base material film was prepared identically with Example 1, except that a high refractive index layer was not formed between a hard coat layer and a low refractive index layer. In other words, a base material film of Example 4 was constituted with a polyethylene terephthalate substrate, hard coat layers, and low refractive index layers.

Example 5

In Example 5, a base material film was prepared identically with Example 1, except that a low refractive index layer was not formed on a high refractive index layer. In other words, a base material film of Example 5 was constituted with a polyethylene terephthalate substrate, hard coat layers, and high refractive index layers.

Example 6

In Example 6, a base material film was prepared identically with Example 1, except that a hard coat layer and a high refractive index layer were not formed. In other words, a base material film of Example 6 was constituted with a polyethylene terephthalate substrate, and low refractive index layers.

Example 7

In Example 7, a base material film was prepared identically with Example 1, except that a hard coat layer, and a low refractive index layer were not formed, the composition for high refractive index layer 5 was used instead of the composition for hard coat layer 1, and a high refractive index layer having a film thickness of 1,200 nm was formed. In other words, a base material film of Example 7 was constituted with a polyethylene terephthalate substrate, and high refractive index layers. The refractive index of a high refractive index layer of a base material film according to Example 7 was 1.63.

Comparative Example 1

In Comparative Example 1, a base material film was prepared identically with Example 1, except that the composition for hard coat layer 2, the composition for high refractive index layer 4, and the composition for low refractive index layer 3 were used instead of the composition for hard coat layer 1, the composition for high refractive index layer 1, and the composition for low refractive index layer 1, and a high refractive index layer having a film thickness of 60 nm was formed. The refractive index of a hard coat layer of a base material film of Comparative Example 1 was 1.53, the same of a high refractive index layer was 1.76, and the same of a low refractive index layer was 1.53.

Comparative Example 2

In Comparative Example 2, a base material film was prepared identically with Example 1, except that the composition for hard coat layer 2, the composition for high refractive index layer 4, and the composition for low refractive index layer 4 were used instead of the composition for hard coat layer 1, the composition for high refractive index layer 1, and the composition for low refractive index layer 1; a high refractive index layer having a film thickness of 65 nm was formed; and a low refractive index layer having a film thickness of 30 nm was formed. The refractive index of a hard coat layer of a base material film of Comparative Example 2 was 1.53, the same of a high refractive index layer was 1.76, and the same of a low refractive index layer was 1.43.

Comparative Example 3

In Comparative Example 3, a base material film was prepared identically with Example 1, except that the composition for high refractive index layer 2, and the composition for low refractive index layer 5 were used instead of the composition for high refractive index layer 1, and the composition for low refractive index layer 1; a high refractive index layer having a film thickness of 65 nm was formed; and a low refractive index layer having a film thickness of 30 nm was formed. The refractive index of a high refractive index layer of a base material film of Comparative Example 3 was 1.76, and the same of a low refractive index layer was 1.33.

The refractive index and film thickness of a hard coat layer, etc. of electroconductive films in Examples 1 to 5, and Comparative Examples 1 to 3 are shown in Table 1.

TABLE 1

|  | Hard coat layer | | High refractive index layer | | Low refractive index layer | |
| --- | --- | --- | --- | --- | --- | --- |
|  | Refractive index | Film thickness (μm) | Refractive index | Film thickness (nm) | Refractive index | Film thickness (nm) |
| Example 1 | 1.52 | 4.5 | 1.67 | 50 | 1.49 | 20 |
| Example 2 | 1.52 | 4.5 | 1.69 | 50 | 1.51 | 20 |
| Example 3 | 1.53 | 4.5 | 1.70 | 60 | 1.53 | 20 |
| Example 4 | 1.52 | 4.5 | — | — | 1.49 | 20 |
| Example 5 | 1.52 | 4.5 | 1.67 | 50 | — | — |
| Example 6 | — | — | — | — | 1.49 | 20 |
| Example 7 | — | — | 1.63 | 1200 | — | — |
| Comparative Example 1 | 1.53 | 4.5 | 1.76 | 60 | 1.53 | 20 |
| Comparative Example 2 | 1.53 | 4.5 | 1.76 | 65 | 1.43 | 20 |
| Comparative Example 3 | 1.52 | 4.5 | 1.76 | 65 | 1.33 | 30 |

<Variation Range of a* and b*>

The variation ranges of a* and b* with respect to each base material film obtained in Examples and Comparative Examples were determined as follows. Specifically, visible light is radiated from the side of a low refractive index layer to each base material film varying the incident angle every five degrees within the range between 5° and 75°, and a* values and b* values were measured for reflected light toward each regular reflection direction using VAR-7010 made by Jasco Corporation. The measurement conditions were as follows. Namely, measurements were carried out such that a deuterium (D2) lamp and a tungsten halogen (WI) lamp were used as a light source, a polarizer with a 45°-tilted transmission axis was used, the measurement range was between 380 nm and 780 nm, the data sampling interval was 1 nm, and the incident angle and the detector position were synchronized to receive regular reflection light. An absolute value of a difference between the maximum value and the minimum value of a* values and b* values obtained from the respective incident angles was calculated to determine a variation range of a* values and a variation range of b* values.

<Variation of Hue>

Variation of hue of each base material film obtained in Examples and Comparative Examples was evaluated by viewing each base material film from various directions. Evaluation criteria were as follows.

○: Variation of hue was not recognized.
×: Variation of hue was recognized.

The results are shown in Table 2 to Table 4.

TABLE 2

|  | 5° | | 10° | | 15° | | 20° | | 25° | | 30° | | 35° | |
| --- | --- | --- | --- | --- | --- | --- | --- | --- | --- | --- | --- | --- | --- | --- |
|  | a* | b* | a* | b* | a* | b* | a* | b* | a* | b* | a* | b* | a* | b* |
| Example 1 | 0.37 | −0.59 | 0.44 | −0.59 | 0.54 | −0.53 | 0.57 | −0.44 | 0.52 | −0.23 | 0.44 | −0.01 | 0.43 | 0.1 |
| Example 2 | 0.42 | −0.62 | 0.50 | −0.62 | 0.62 | −0.56 | 0.65 | −0.46 | 0.59 | −0.24 | 0.50 | −0.01 | 0.49 | 0.11 |
| Example 3 | 0.50 | −0.67 | 0.54 | −0.67 | 0.73 | −0.62 | 0.77 | −0.52 | 0.71 | −0.27 | 0.60 | −0.01 | 0.58 | 0.12 |
| Example 4 | −0.03 | −0.48 | −0.03 | −0.49 | −0.03 | −0.49 | −0.03 | −0.51 | −0.03 | −0.52 | −0.03 | −0.54 | −0.03 | −0.55 |
| Example 5 | −0.28 | −3.62 | −0.30 | −3.70 | −0.30 | −0.38 | −0.26 | −3.75 | −0.20 | −3.74 | −0.15 | −3.70 | −0.06 | −3.68 |
| Example 6 | −0.30 | −3.72 | −0.31 | −3.72 | −0.32 | −3.75 | −0.27 | −3.73 | −0.21 | −3.76 | −0.18 | −3.75 | −0.14 | −3.70 |
| Example 7 | 0.15 | −1.13 | 0.15 | −1.11 | 0.15 | −1.09 | 0.15 | −1.07 | 0.17 | −1.01 | 0.23 | −0.97 | 0.29 | −0.87 |
| Comparative Example 1 | −0.48 | 0.29 | −0.48 | 0.14 | −0.48 | −0.09 | −0.47 | −0.39 | −0.46 | −0.76 | −0.45 | −1.16 | −0.42 | −1.58 |
| Comparative Example 2 | −0.48 | 0.36 | −0.46 | 0.18 | −0.47 | −0.11 | −0.47 | −0.49 | −0.46 | −0.95 | −0.45 | −1.45 | −0.41 | −1.98 |
| Comparative Example 3 | −0.48 | 0.44 | −0.46 | 0.21 | −0.50 | −0.14 | −0.48 | −0.59 | −0.45 | −1.15 | −0.46 | −1.76 | −0.42 | −2.39 |

TABLE 3

|  | 40° | | 45° | | 50° | | 55° | | 60° | | 65° | | 70° | | 75° | |
| --- | --- | --- | --- | --- | --- | --- | --- | --- | --- | --- | --- | --- | --- | --- | --- | --- |
|  | a* | b* | a* | b* | a* | b* | a* | b* | a* | b* | a* | b* | a* | b* | a* | b* |
| Example 1 | 0.52 | 0.14 | 0.62 | 0.34 | 0.59 | 0.55 | 0.46 | 0.62 | 0.4 | 0.68 | 0.34 | 0.72 | 0.35 | 0.68 | 0.41 | 0.71 |
| Example 2 | 0.59 | 0.15 | 0.71 | 0.36 | 0.67 | 0.53 | 0.53 | 0.65 | 0.46 | 0.71 | 0.39 | 0.73 | 0.40 | 0.71 | 0.47 | 0.72 |
| Example 3 | 0.71 | 0.16 | 0.84 | 0.40 | 0.80 | 0.65 | 0.62 | 0.73 | 0.54 | 0.80 | 0.46 | 0.85 | 0.47 | 0.80 | 0.56 | 0.84 |

TABLE 3-continued

| | 40° | | 45° | | 50° | | 55° | | 60° | | 65° | | 70° | | 75° | |
|---|---|---|---|---|---|---|---|---|---|---|---|---|---|---|---|---|
| | a* | b* | a* | b* | a* | b* | a* | b* | a* | b* | a* | b* | a* | b* | a* | b* |
| Example 4 | −0.03 | −0.57 | −0.03 | −0.59 | −0.04 | −0.61 | −0.04 | −0.63 | −0.04 | −0.65 | −0.04 | −0.67 | −0.04 | −0.68 | −0.04 | −0.70 |
| Example 5 | −0.20 | −3.55 | −0.38 | −3.33 | −0.35 | −3.12 | −0.10 | −2.84 | 0.16 | −2.42 | 0.20 | −1.85 | 0.05 | −1.41 | −0.18 | −1.32 |
| Example 6 | −0.23 | −3.55 | −0.40 | −3.28 | −0.33 | −3.01 | −0.10 | −2.70 | 0.23 | −2.41 | 0.20 | −1.92 | 0.05 | −1.41 | −0.15 | −0.88 |
| Example 7 | 0.33 | −0.76 | 0.33 | −0.67 | 0.31 | −0.55 | 0.32 | −0.42 | 0.35 | −0.28 | 0.33 | −0.19 | 0.21 | −0.02 | 0.26 | 0.27 |
| Comparative Example 1 | −0.39 | −1.96 | −0.35 | −2.66 | −0.31 | −2.56 | −0.26 | −2.69 | −0.21 | −2.68 | −0.15 | −2.49 | −0.06 | −2.47 | −0.03 | −2.48 |
| Comparative Example 2 | −0.38 | −2.46 | −0.34 | −3.36 | −0.3 | −3.21 | −0.25 | −3.37 | −0.2 | −3.36 | −0.16 | −3.12 | −0.05 | −3.1 | −0.04 | −3.11 |
| Comparative Example 3 | −0.38 | −2.97 | −0.35 | −4.03 | −0.33 | −3.88 | −0.24 | −4.08 | −0.19 | −4.06 | −0.17 | −3.77 | −0.07 | −3.74 | −0.02 | −3.76 |

TABLE 4

| | Variation range of a* values | Variation range of b* values | Variation of hue |
|---|---|---|---|
| Example 1 | 0.28 | 1.29 | ○ |
| Example 2 | 0.32 | 1.35 | ○ |
| Example 3 | 0.38 | 1.52 | ○ |
| Example 4 | 0.01 | 0.22 | ○ |
| Example 5 | 0.58 | 2.48 | ○ |
| Example 6 | 0.63 | 2.88 | ○ |
| Example 7 | 0.20 | 1.40 | ○ |
| Comparative Example 1 | 0.45 | 3.03 | x |
| Comparative Example 2 | 0.44 | 3.80 | x |
| Comparative Example 3 | 0.48 | 4.59 | x |

As shown in Table 4, with respect to the base material films of Comparative Examples 1 to 3, the requirements that the variation range of a* values is within 1.0 and the variation range of b* values is within 3.0 were not satisfied, and the variation of hue could not be suppressed.

In contrast, with respect to the base material films of Examples 1 to 7, the requirements that the variation range of a* values is within 1.0 and the variation range of b* values is within 3.0 were satisfied, and the variation of hue could be suppressed.

REFERENCE SIGNS LIST 10, 50, 100, 110 Electroconductive film
11, 51, 101, 111 Base material film
12, 41 Transparent electroconductive layer
13, 42, 54, 55 Lead-out electrode
20, 59 Light transmissive base material
21, 22, 60, 61, 102, 112, 113 Functional layer
23, 27, 62, 66 Easily adhesive layer
24, 28, 63, 67 Hard coat layer
25, 64, 68, 103, 114, 115 High refractive index layer
26, 65, 69 Low refractive index layer
30, 90 Touch panel

The invention claimed is:

1. An electroconductive film comprising:
a base material film provided with a light transmissive base material, and one or more functional layers laminated on a single or both sides of the light transmissive base material,
a transparent electroconductive layer, which is provided on the functional layer, and patterned, and
a lead-out electrode electrically connected with the transparent electroconductive layer,
wherein
[1] the one or more functional layers has a first configuration comprising a high refractive index layer provided on the light transmissive base material, and a low refractive index layer provided on the high refractive index layer, or
[2] the one or more functional layers has a second configuration comprising a high refractive index layer provided on the light transmissive base material, but does not comprise a low refractive index layer, or
[3] the one or more functional layers has a third configuration comprising a low refractive index layer provided on the light transmissive base material, but does not comprise a high refractive index layer,
wherein the high refractive index layer in the first configuration or the second configuration has a refractive index of 1.55 or more and 1.75 or less, and the low refractive index layer in the first configuration or the third configuration has a refractive index of not less than 1.35 but less than 1.55,
wherein the high refractive index layer in the first configuration or the second configuration comprises a high refractive index particle and a binder resin, and the low refractive index layer in the first configuration or the third configuration comprises a low refractive index particle and a binder resin, or comprises a low refractive index resin,
wherein when the base material film is irradiated with light from a surface side of the functional layer while an incidence angle is varied every five degrees in a range of 5° or more and 75° or less, when a normal direction of a surface of the base material film is 0°, to determine a* and b* values of the base material film in a L*a*b* color system from reflected light toward each regular reflection direction, a variation of the a* values is 1.0 or less, and a variation of the b* values is 3.0 or less with respect to the base material film, and
wherein each of the one or more functional layers has a thickness and a refractive index that are selected to obtain the variation of the a* values that is 1.0 or less and the variation of the b* values that is 3.0 or less.

2. The electroconductive film according to claim 1, wherein the high refractive index layer in the first configuration or the second configuration has a thickness of 20 nm or more and 100 nm or less.

3. The electroconductive film according to claim 1, wherein the low refractive index layer in the first configuration or the third configuration has a thickness of 3 nm or more and 100 nm or less.

4. The electroconductive film according to claim 1, wherein the refractive index difference between the high refractive index layer and the low refractive index layer in the first configuration is 0.10 or more and 0.30 or less.

5. The electroconductive film according to claim 1, wherein the one or more functional layers further comprises a hard coat layer having a refractive index of 1.45 or more and 1.60 or less and a thickness of 0.5 μm or more, and wherein
when the one ore more functional layers has the first configuration or the second configuration, the hard coat layer is provided between the light transmissive base material and the high refractive index layer, and
when the one or more functional layers has the third configuration, the hard coat layer is provided between the light transmissive base material and the low refractive index layer.

6. The electroconductive film according to claim 5, wherein the refractive index difference between the hard coat layer and the high refractive index layer in the first configuration or the second configuration is 0.05 or more and 0.20 or less.

7. The electroconductive film according to claim 5, wherein the one or more functional layers further comprises an adhesive layer having a refractive index of 1.40 or more and 1.70 or less and a thickness of 50 nm or more and 150 nm or less between the light transmissive base material and the hard coat layer.

8. The electroconductive film according to claim 1, wherein the one or more functional layers further comprises an adhesive layer having a refractive index of 1.40 or more and 1.70 or less and a thickness of 50 nm or more and 150 nm or less, and wherein
when the one or more functional layers has the first configuration or the second configuration, the adhesive layer is provided between the light transmissive base material and the high refractive index layer, and when the one or more functional layers has the third configuration, the adhesive layer is provided between the light transmissive base material and the low refractive index layer.

9. The electroconductive film according to claim 1, wherein the high refractive index layer has a thickness of 0.5 μm or more and 10 μm or less.

10. The electroconductive film according to claim 1, wherein the lead-out electrode is provided on only a part of the transparent electroconductive layer.

11. The electroconductive film according to claim 1, wherein the transparent electroconductive layer is tin-doped indium oxide.

12. The electroconductive film according to claim 1, wherein the light transmissive base material is a polyester base material.

13. A touch panel sensor comprising the electroconductive film according to claim 1.

14. The electroconductive film according to claim 1, wherein the high refractive index layer has a refractive index of 1.55 or more and 1.69 or less.

15. The electroconductive film according to claim 1, wherein the low refractive index layer has a refractive index of 1.49 or more and less than 1.55.

16. The electroconductive film according to claim 1, wherein the high refractive index layer has a thickness of 30 nm or more and 100 nm or less.

17. The electroconductive film according to claim 1, wherein the functional layer does not comprise a hard coat layer.

18. The electroconductive film according to claim 17, wherein the high refractive index layer has a thickness of 0.5 μm or more and 10 μm or less.

* * * * *